(12) United States Patent
Chen

(10) Patent No.: US 12,563,794 B2
(45) Date of Patent: Feb. 24, 2026

(54) SEMICONDUCTOR DEVICES, MEMORY DEVICES, AND METHODS FOR FORMING THE SAME

(71) Applicant: YANGTZE MEMORY TECHNOLOGIES CO., LTD., Wuhan (CN)

(72) Inventor: Liang Chen, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 614 days.

(21) Appl. No.: 17/583,733

(22) Filed: Jan. 25, 2022

(65) Prior Publication Data

US 2023/0215915 A1 Jul. 6, 2023

Related U.S. Application Data

(63) Continuation of application No. PCT/CN2022/070044, filed on Jan. 4, 2022.

(51) Int. Cl.
*H10D 62/10* (2025.01)
*G11C 16/04* (2006.01)
(Continued)

(52) U.S. Cl.
CPC ....... *H10D 62/116* (2025.01); *G11C 16/0483* (2013.01); *H10B 41/35* (2023.02);
(Continued)

(58) Field of Classification Search
CPC . H01L 21/76237; H01L 21/76; H01L 21/762; H01L 21/76213; H01L 21/76216;
(Continued)

(56) References Cited

U.S. PATENT DOCUMENTS 5,358,890 A * 10/1994 Sivan ..................... H01L 21/32
257/E21.258
6,165,871 A 12/2000 Lim et al.
(Continued)

FOREIGN PATENT DOCUMENTS

CN 102592998 A 7/2012
CN 103165447 A 6/2013
(Continued)

OTHER PUBLICATIONS

International Search Report issued in corresponding International Application No. PCT/CN2022/070044, mailed Sep. 30, 2022, 4 pages.
(Continued)

*Primary Examiner* — Britt D Hanley
*Assistant Examiner* — Jason James Greaving
(74) *Attorney, Agent, or Firm* — BAYES PLLC

(57) ABSTRACT

In certain aspects, a semiconductor device includes a substrate, a first trench isolation in the substrate, a first doped region formed below the first trench isolation, a second doped region formed in the substrate, and a first gate structure formed adjacent to the second doped region. The first doped region is an ion implantation region, and a distance between the first doped region and the second doped region is equal to or more than 0.6 μm.

20 Claims, 25 Drawing Sheets

(51) Int. Cl.

| | | |
|---|---|---|
| *H10B 41/35* | (2023.01) | |
| *H10B 41/40* | (2023.01) | |
| *H10B 43/35* | (2023.01) | |
| *H10B 43/40* | (2023.01) | |

(52) U.S. Cl.
CPC ............. *H10B 41/40* (2023.02); *H10B 43/35* (2023.02); *H10B 43/40* (2023.02)

(58) Field of Classification Search
CPC ... H01L 29/7833–7836; H01L 29/0653; H01L 25/26; G11C 16/0483; H10B 41/35; H10B 43/35; H10D 89/00–931; H10D 62/116
See application file for complete search history.

(56) References Cited

U.S. PATENT DOCUMENTS

| | | | | |
|---|---|---|---|---|
| 9,257,555 B1 * | 2/2016 | Lin | .................... | H01L 29/1045 |
| 9,525,045 B1 | 12/2016 | Lee et al. | | |
| 2006/0079068 A1 * | 4/2006 | Sheu | .................... | H10B 12/038 |
| | | | | 257/E21.628 |
| 2009/0108348 A1 | 4/2009 | Yang et al. | | |
| 2009/0224335 A1 * | 9/2009 | Chang | ................. | H10D 64/519 |
| | | | | 257/E21.409 |
| 2009/0289304 A1 * | 11/2009 | Pouydebasque | ..... | H10D 86/011 |
| | | | | 438/154 |
| 2014/0027816 A1 * | 1/2014 | Cea | .................... | H01L 29/1054 |
| | | | | 257/E29.085 |
| 2015/0021687 A1 * | 1/2015 | Tamura | ................ | H10D 84/038 |
| | | | | 438/424 |
| 2015/0048458 A1 * | 2/2015 | Zhu | ...................... | H10D 30/601 |
| | | | | 257/369 |
| 2015/0061004 A1 | 3/2015 | Jung | | |
| 2016/0064558 A1 | 3/2016 | Lin et al. | | |
| 2019/0198633 A1 | 6/2019 | Chien et al. | | |
| 2020/0090981 A1 | 3/2020 | Donnelly | | |
| 2021/0066296 A1 * | 3/2021 | Kutsukake | ........ | H01L 21/76237 |
| 2021/0257446 A1 * | 8/2021 | Miyata | ............. | H01L 21/02148 |
| 2021/0288048 A1 * | 9/2021 | Chuang | ........... | H01L 21/823462 |
| 2022/0069081 A1 * | 3/2022 | Lin | ..................... | H01L 29/7835 |
| 2022/0085048 A1 * | 3/2022 | Lee | ........................ | H10B 43/40 |
| 2022/0109069 A1 * | 4/2022 | Mun | ................... | H10D 84/013 |

FOREIGN PATENT DOCUMENTS

| | | |
|---|---|---|
| CN | 103426915 A | 12/2013 |
| CN | 108615675 A | 10/2018 |
| CN | 110767551 A | 2/2020 |
| CN | 112103341 A | 12/2020 |
| CN | 113192890 A | 7/2021 |

OTHER PUBLICATIONS

Extended European Search Report issued in corresponding European Application No. EP22917685.4, mailed Oct. 23, 2025, 10 pages.

* cited by examiner

100

101

400

400

Poly

401

403

405

404

421

STI    FLD

411

413

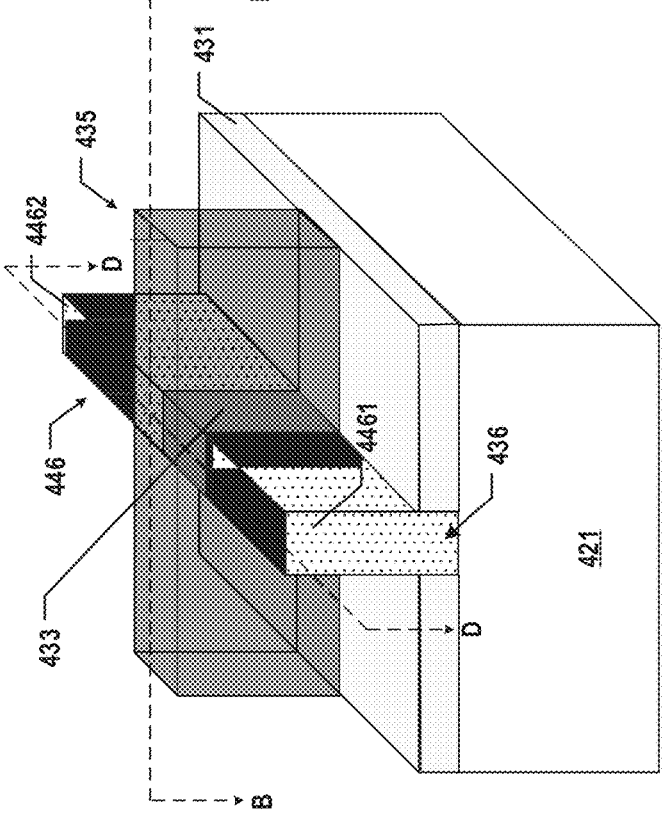
430
FIG. 4E
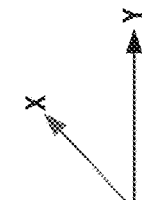

500

5111

521

500

5113

511

521

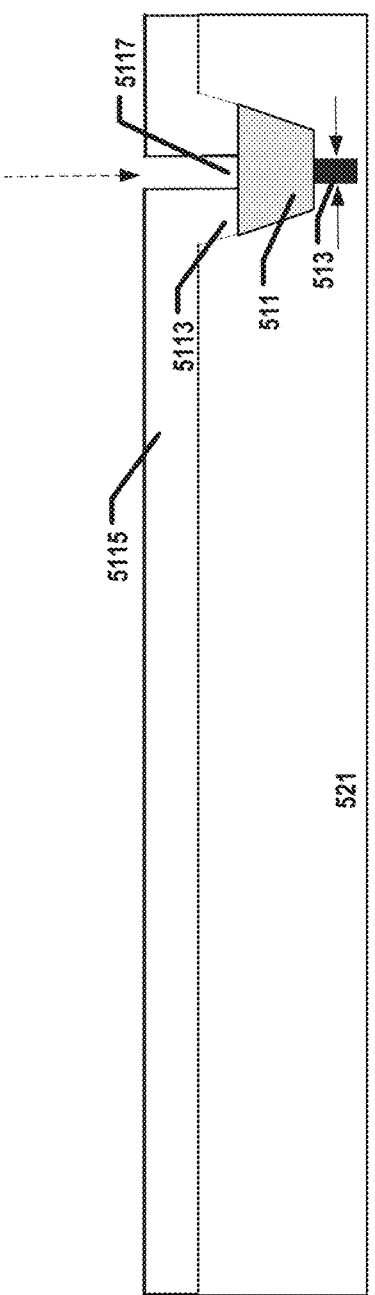
500
5117
5113
511
513
5115
521
FIG. 5C

600

600

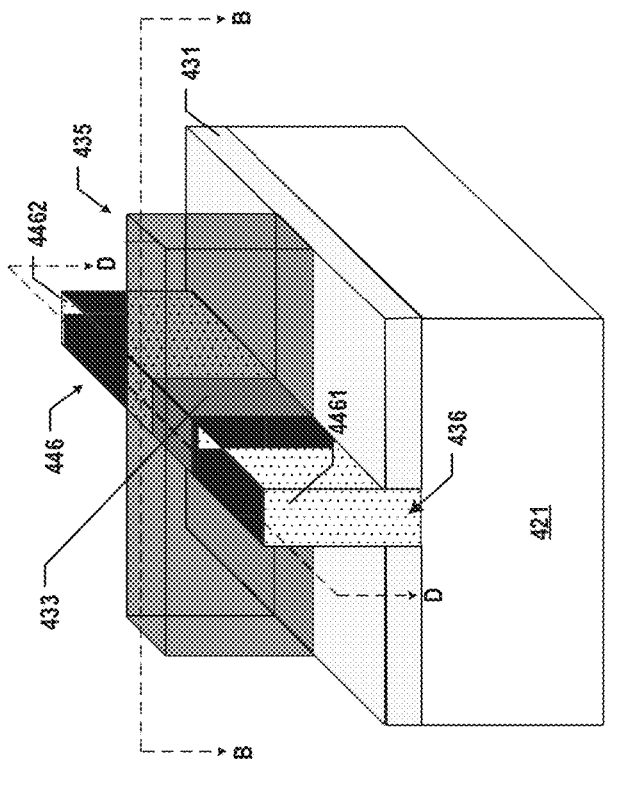
FIG. 6H
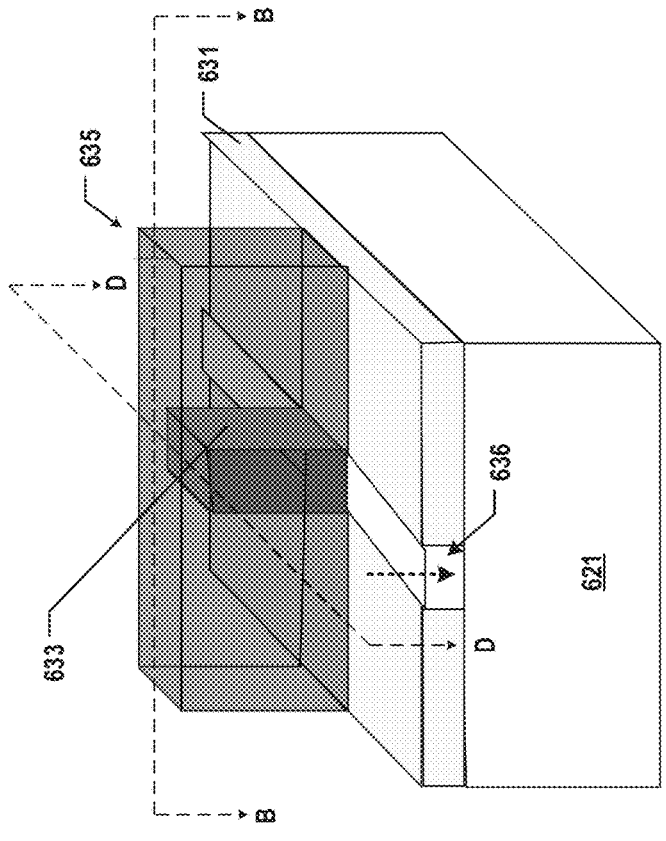
FIG. 6G
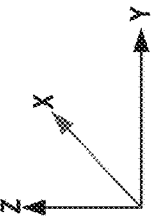

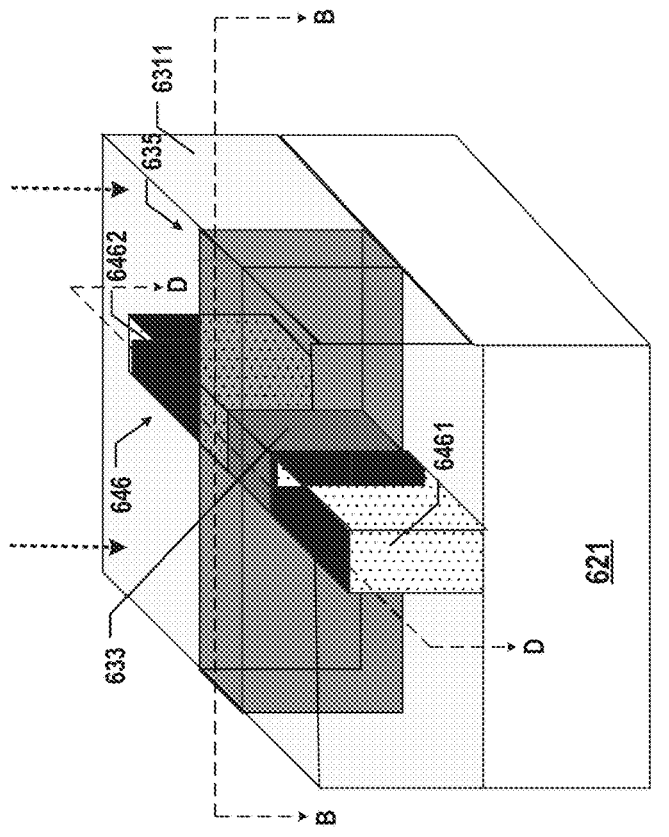
FIG. 6J
FIG. 6I
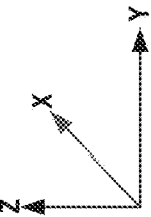

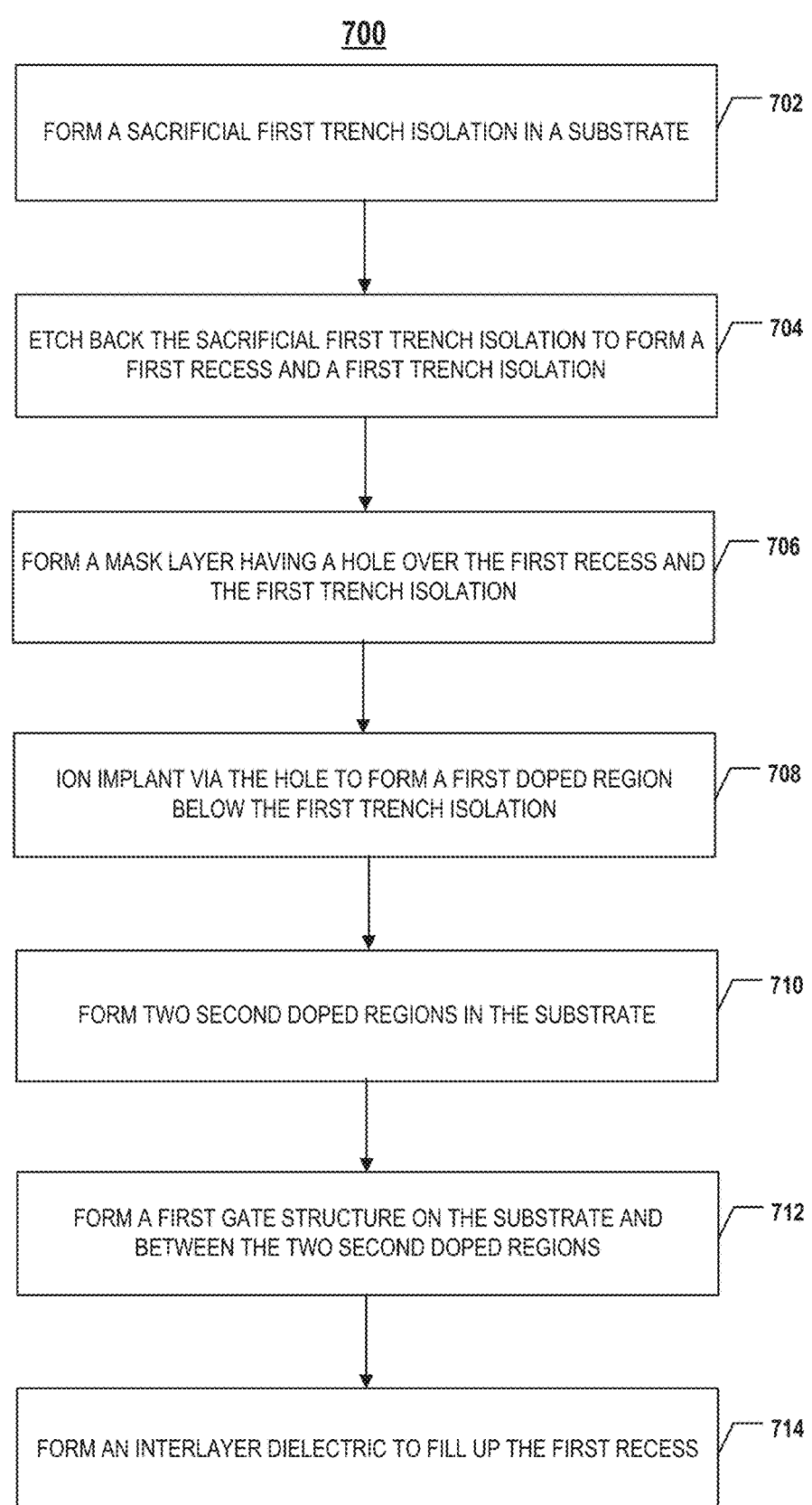

700

FORM A SACRIFICIAL FIRST TRENCH ISOLATION IN A SUBSTRATE — 702

ETCH BACK THE SACRIFICIAL FIRST TRENCH ISOLATION TO FORM A FIRST RECESS AND A FIRST TRENCH ISOLATION — 704

FORM A MASK LAYER HAVING A HOLE OVER THE FIRST RECESS AND THE FIRST TRENCH ISOLATION — 706

ION IMPLANT VIA THE HOLE TO FORM A FIRST DOPED REGION BELOW THE FIRST TRENCH ISOLATION — 708

FORM TWO SECOND DOPED REGIONS IN THE SUBSTRATE — 710

FORM A FIRST GATE STRUCTURE ON THE SUBSTRATE AND BETWEEN THE TWO SECOND DOPED REGIONS — 712

FORM AN INTERLAYER DIELECTRIC TO FILL UP THE FIRST RECESS — 714

FIG. 7

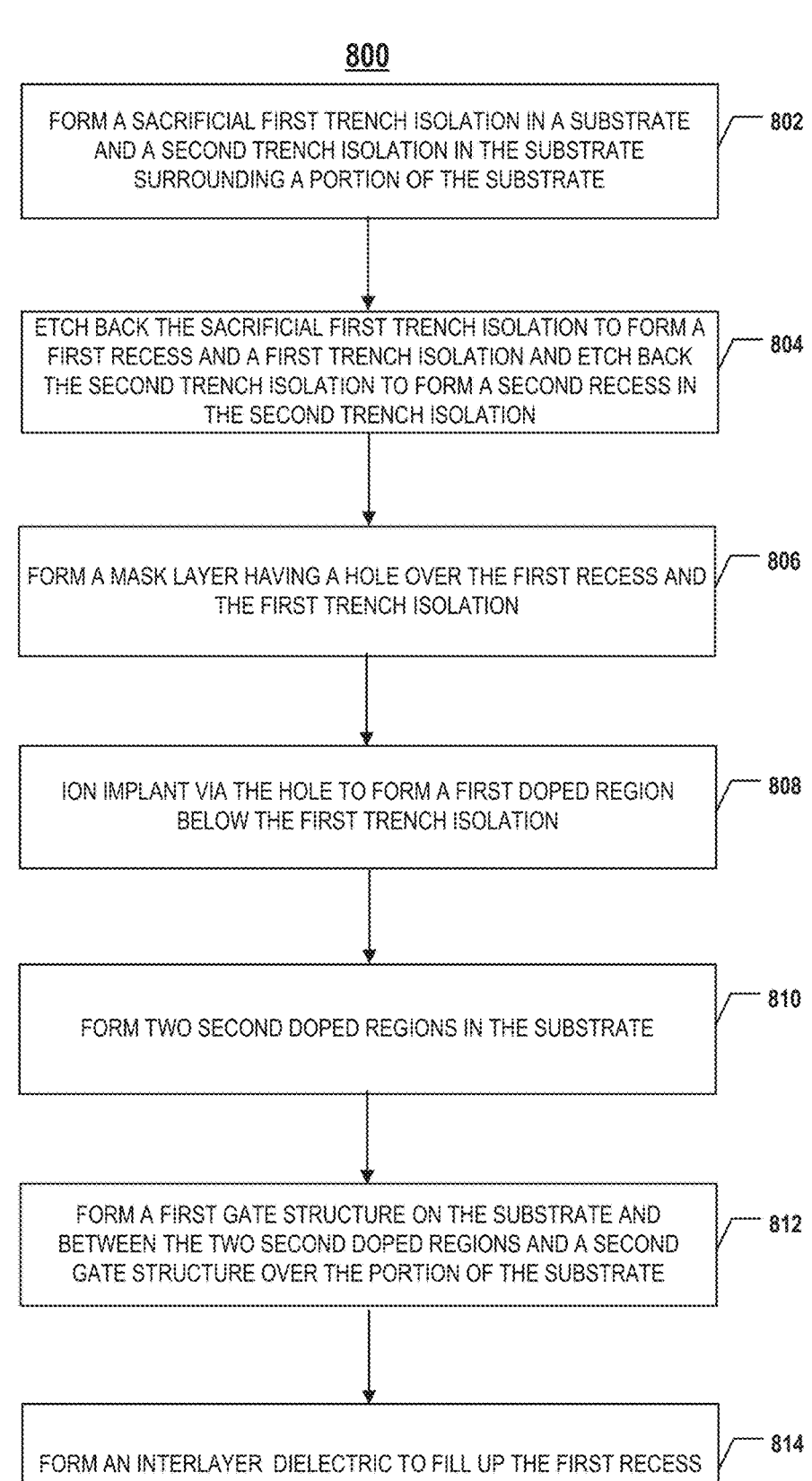

800

FORM A SACRIFICIAL FIRST TRENCH ISOLATION IN A SUBSTRATE AND A SECOND TRENCH ISOLATION IN THE SUBSTRATE SURROUNDING A PORTION OF THE SUBSTRATE — 802

ETCH BACK THE SACRIFICIAL FIRST TRENCH ISOLATION TO FORM A FIRST RECESS AND A FIRST TRENCH ISOLATION AND ETCH BACK THE SECOND TRENCH ISOLATION TO FORM A SECOND RECESS IN THE SECOND TRENCH ISOLATION — 804

FORM A MASK LAYER HAVING A HOLE OVER THE FIRST RECESS AND THE FIRST TRENCH ISOLATION — 806

ION IMPLANT VIA THE HOLE TO FORM A FIRST DOPED REGION BELOW THE FIRST TRENCH ISOLATION — 808

FORM TWO SECOND DOPED REGIONS IN THE SUBSTRATE — 810

FORM A FIRST GATE STRUCTURE ON THE SUBSTRATE AND BETWEEN THE TWO SECOND DOPED REGIONS AND A SECOND GATE STRUCTURE OVER THE PORTION OF THE SUBSTRATE — 812

FORM AN INTERLAYER DIELECTRIC TO FILL UP THE FIRST RECESS — 814

FIG. 8

SEMICONDUCTOR DEVICES, MEMORY DEVICES, AND METHODS FOR FORMING THE SAME

CROSS-REFERENCE TO RELATED APPLICATIONS

This application is continuation of International Application No. PCT/CN2022/070044, filed on Jan. 4, 2022, entitled "SEMICONDUCTOR DEVICES, MEMORY DEVICES, AND METHODS FOR FORMING THE SAME," which is hereby incorporated by reference in its entirety.

BACKGROUND

The present disclosure relates to semiconductor devices, memory devices, and fabrication methods thereof.

Integrated circuit isolation, such as local oxidation of silicon (LOCOS), deep trench isolation, and shallow trench isolation (STI, a.k.a. box isolation technique), is a part of an integrated circuit which separates circuit components and prevents electric current leakage between adjacent circuit components. For advanced complementary metal oxide semiconductor (CMOS) process, trench isolation, particularly STI, has played an important role in providing isolation between active regions of transistors.

SUMMARY

In one aspect, a semiconductor device includes a substrate, a first trench isolation in the substrate, a first doped region formed below the first trench isolation, two second doped regions formed in the substrate, and a first gate structure formed between the two second doped regions.

In another aspect, a memory device includes a memory cell array, and a peripheral circuit coupled to the memory cell array. The peripheral circuit includes a high voltage (HV) circuit. The HV circuit includes a substrate, a first trench isolation in the substrate, a first doped region formed below the first trench isolation, two second doped regions formed in the substrate, and a first gate structure formed between the two second doped regions.

In still another aspect, a method for forming a semiconductor device includes forming a sacrificial first trench isolation in a substrate, etching back the sacrificial first trench isolation to form a first recess and a first trench isolation in the substrate, forming a mask layer having a hole over the first recess and the first trench isolation, ion implanting via the hole to form a first doped region below the first trench isolation, forming two second doped regions in the substrate, and forming a first gate structure on the substrate and between the two second doped regions.

In yet another aspect, a method for forming a semiconductor device includes forming a sacrificial first trench isolation in a substrate and forming a second trench isolation in the substrate surrounding a portion of the substrate, etching back the sacrificial first trench isolation to form a first recess and a first trench isolation in the substrate and etching back the second trench isolation to form a second recess in the second trench isolation, forming a mask layer having a hole over the first recess and the first trench isolation, ion implanting via the hole to form a first doped region below the first trench isolation, forming two second doped regions in the substrate, and forming a first gate structure on the substrate and between the two second doped regions and a second gate structure over the portion of the substrate.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 4E illustrates a perspective view of a 3D transistor of a semiconductor device, according to some aspects of the present disclosure.

FIGS. 5A-5F illustrate a fabrication process for forming a semiconductor device, according to some aspects of the present disclosure.

FIGS. 6A-6J illustrate a fabrication process for forming a semiconductor device, according to some aspects of the present disclosure.

FIG. 7 illustrates a flowchart of a method for forming an exemplary semiconductor device, according to some aspects of the present disclosure.

FIG. 8 illustrates a flowchart of a method for forming an exemplary semiconductor device, according to some aspects of the present disclosure.

Figure 1A:
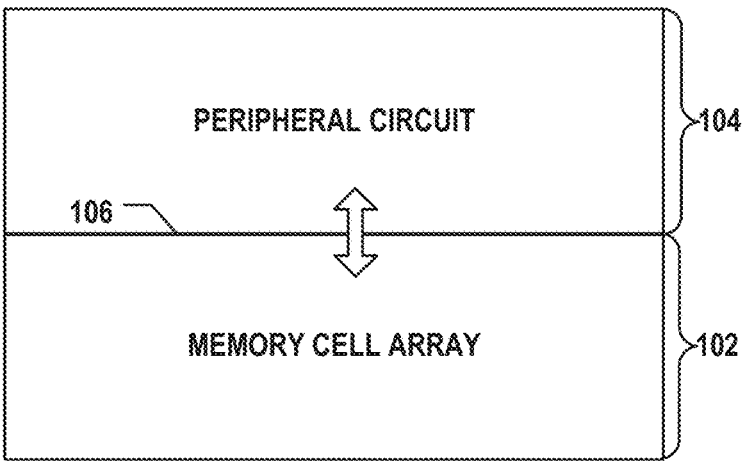
FIG. 1A illustrates a schematic view of a cross-section of an exemplary memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors (in which interconnect lines and/or vertical interconnect access (via) contacts are formed) and one or more dielectric layers.

In a 3D NAND memory device, string driver is the most common and one of the most important circuits configured to control an array of 3D NAND memory strings. Specifically, more stacked memory cell arrays require more peripheral circuits for operating multiple semiconductor devices (e.g., memory devices), thereby demanding more high voltage transistors of string drivers in the peripheral circuits. One of the reasons for high voltage transistor failure is the electrical breakdown. For instance, during the programming process of the memory cells, the high voltage transistor of the string driver may sustain more than 25 voltage (V) bias. Furthermore, adjacent high voltage transistors may have a 25 V voltage difference from each other. Though there may be trench isolations (STIs) to separate and isolate each high voltage transistor, the breakdown voltage requirement increases significantly. Moreover, during the erasing process of the memory cells, the high voltage transistors may sustain another more than 24 V bias from the array coupling. These high voltages during operations may cause electrical breakdown of the high voltage transistors. As array stacks increase, the breakdown voltage requirement increases. While the trench isolation may provide isolation to adjacent transistors or other semiconductor devices, the limited chip area restricts the expansion of the width and depth of the trench isolation, thereby limiting the further improvement of breakdown voltage.

One of the bottlenecks of the breakdown voltage, i.e., the breakdown path, is a space between a heavily doped n-well, also known as n plus (NP) region of the high voltage transistor, and the trench isolation. In some implementations, a p-well, also known as field light doping (FLD) region, below the trench isolation is further formed to provide additional breakdown voltage. This space between the NP and the FLD becomes the critical point of the breakdown voltage of the high voltage transistor. If the space can be extended, the breakdown voltage can be increased.

To address one or more of the aforementioned issues, the present disclosure introduces a solution in which a trench isolation is thinned by removing part of the trench isolation above, and a mask layer, which can be a photoresist layer, is provided to cover the thinned trench isolation and to ion implant via a hole of the mask layer and through the thinned trench isolation to form an FLD region below the thinned trench isolation, thereby reducing the width of the FLD region and thus increasing the breakdown voltage of the high voltage transistor. Furthermore, in some implementations, some steps of methods of forming the FLD region can be configured to form a 3D transistor as well as the high voltage transistor in the same process, which significantly simplified the fabrication processes and reduce the cost for each process.

It is noted that the present disclosure uses an exemplary 3D transistor and an exemplary high voltage transistor for illustrating how to form the disclosed trench isolation in the same process with these transistors. Any semiconductor devices having other types of 3D transistors or high voltage transistors with similar traits can also be implemented using the disclosed method with suitable modification.

FIG. 1A illustrates a schematic view of a cross-section of a memory device 100, according to some aspects of the present disclosure. Memory device 100 represents an example of a bonded chip. The components of memory device 100 (e.g., memory cell array and peripheral circuits) can be formed separately on different substrates and then jointed to form a bonded chip. Memory device 100 can include a first semiconductor structure 102 including an array of memory cells (memory cell array). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as dynamic random access memory (DRAM) cell array, static random access memory (SRAM) cell array, NOR Flash memory cell array, phase change memory (PCM) cell array, resistive memory cell array, magnetic memory cell array, spin transfer torque (STT) memory cell array, to name a few, or any combination thereof.

First semiconductor structure 102 can be a NAND Flash memory device in which memory cells are provided in the form of an array of 3D NAND memory strings and/or an array of two-dimensional (2D) NAND memory cells. NAND memory cells can be organized into fingers, which are then organized into blocks in which each NAND memory cell is electrically connected to a separate line called a bit line (BL). All cells with the same vertical position in the NAND memory cell can be electrically connected through the control gates by a word line (WL). In some implementations, a plane contains a certain number of blocks that are electrically connected through the same bit line. First semiconductor structure 102 can include one or more planes, and the peripheral circuits that are needed to perform all the read/program (write)/erase operations can be included in a second semiconductor structure 104.

In some implementations, the array of NAND memory cells is an array of 2D NAND memory cells, each of which includes a floating-gate transistor. The array of 2D NAND memory cells include a plurality of 2D NAND memory strings, each of which includes a plurality of memory cells (e.g., 32 to 128 memory cells) connected in series (resembling a NAND gate) and two select transistors, according to some implementations. Each 2D NAND memory string is arranged in the same plane on the substrate (in 2D), according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

As shown in FIG. 1A, memory device 100 can also include second semiconductor structure 104 including the peripheral circuits of the memory cell array of first semiconductor structure 102. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). For instance, the peripheral circuit may include a 3D transistor and a high voltage transistor in accordance with some implementations of the present disclosure.

As shown in FIG. 1A, memory device 100 further includes a bonding interface 106 vertically between first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in first semiconductor structure 102 and the peripheral circuits in second semiconductor structure 104 can be performed through the interconnects (e.g., bonding contacts) across bonding interface 106. By vertically integrating first and second semiconductor structures 102 and 104, the chip size can be reduced, and the memory cell density can be increased.

Figure 1B:
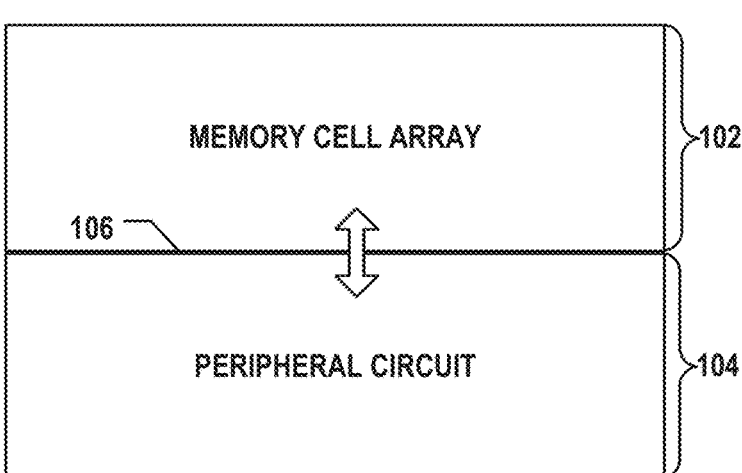
FIG. 1B illustrates a schematic view of a cross-section of another exemplary memory device, according to some aspects of the present disclosure.

It is understood that the relative positions of stacked first and second semiconductor structures 102 and 104 are not limited. FIG. 1B illustrates a schematic view of a cross-section of another exemplary memory device 101, according to some implementations. Different from memory device 100 in FIG. 1A in which second semiconductor structure 104 including the peripheral circuits is above first semiconductor structure 102 including the memory cell array, in memory device 101 in FIG. 1B, first semiconductor structure 102 including the memory cell array is above second semiconductor structure 104 including the peripheral circuits. Nevertheless, bonding interface 106 is formed vertically between first and second semiconductor structures 102 and 104 in memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., Cu-to-Cu) bonding and dielectric-dielectric (e.g., SiO2-to-SiO2) bonding simultaneously. Data transfer between the memory cell array in first semiconductor structure 102 and the peripheral circuits in second semiconductor structure 104 can be performed through the interconnects (e.g., bonding contacts) across bonding interface 106.

Figure 2:
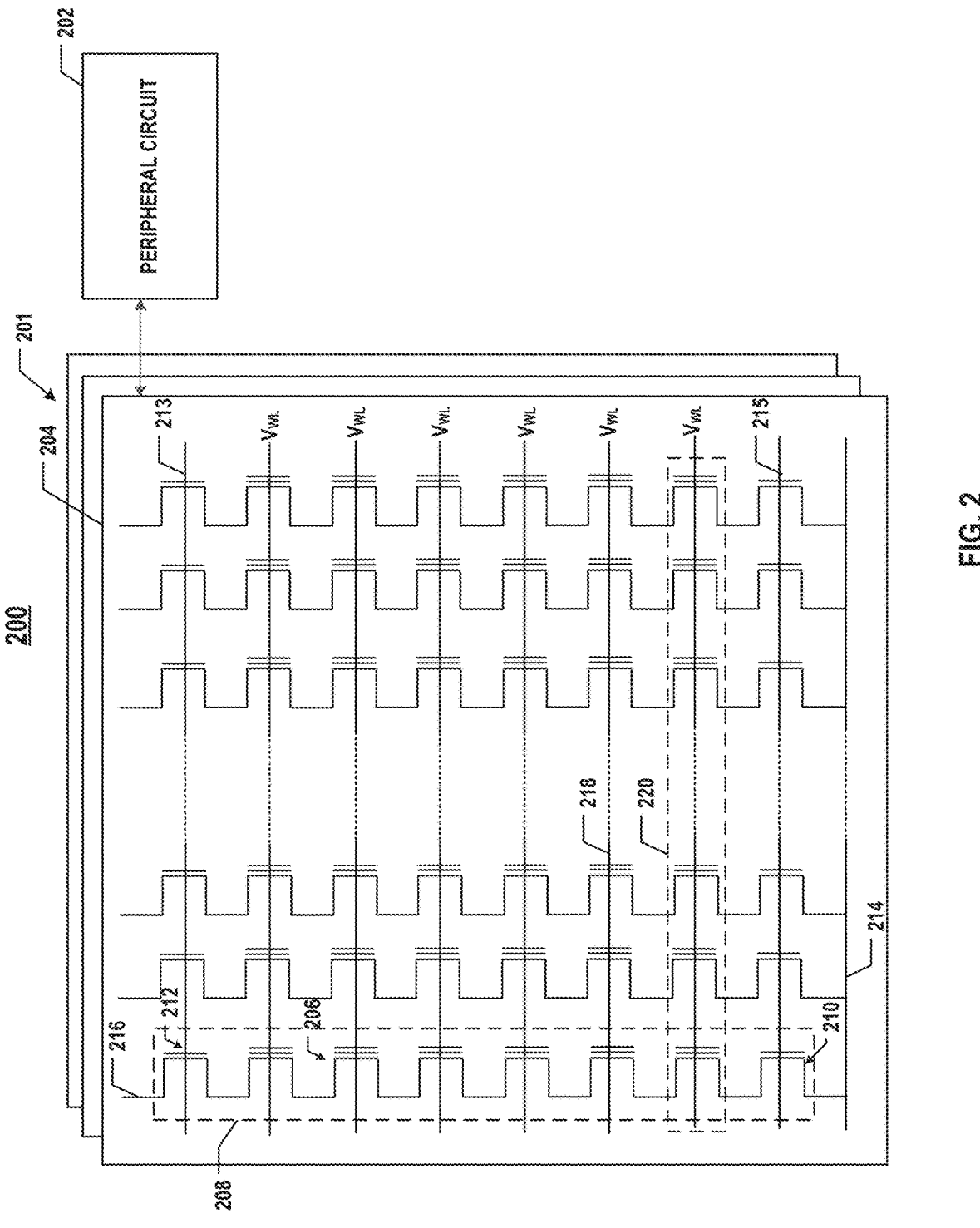
FIG. 2 illustrates a schematic circuit diagram of an exemplary memory device including peripheral circuits having a page buffer, according to some aspects of the present disclosure.

FIG. 2 illustrates a schematic circuit diagram of a memory device 200 including peripheral circuits, according to some aspects of the present disclosure. Memory device 200 can include a memory cell array 201 and peripheral circuits 202 coupled to memory cell array 201. Memory devices 100 and 101 may be examples of memory device 200 in which memory cell array 201 and peripheral circuits 202 may be included in first semiconductor structures 102 and second semiconductor structures 104, respectively. Memory cell array 201 can be a NAND Flash memory cell array in which memory cells 206 are provided in the form of an array of 3D NAND memory strings 208 each extending vertically above a substrate (not shown). In some implementations, each 3D NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing two memory states. In some implementations, each memory cell 206 can be a triple-level cell (TLC), or a quad-level cell (QLC). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each 3D NAND memory string 208 can include a source select gate (SSG) transistor 210 at its source end and a drain select gate (DSG) transistor 212 at its drain end, such that SSG transistor 210 and DSG transistor 212 can be configured to activate selected 3D NAND memory strings 208 (columns of the array) via the source end and the drain end during read and program operations. In some implementations, the sources of SSG transistors 210 of 3D NAND memory strings 208 in the same block 204 are coupled through the same source line (SL) 214, e.g., a common SL, for example, to the ground. In some implementation, the drain of the DSG transistor 212 of 3D NAND memory strings 208 in the same block 204 are coupled to a page buffer (not shown), in peripheral circuit 202. DSG transistor 212 of each 3D NAND memory string 208 is coupled to a respective bit line 216 from which data can be read or programmed via an output bus (not shown), according to some implementations. In some implementations, each 3D NAND memory string 208 is configured to be selected or unselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, 3D NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 can be coupled through word lines 218 that select which row of memory cells 206 is affected by read and program operations. In some implementations, each word line 218 is coupled to a row 220 of memory cells 206, which is the basic data unit for program and read operations. Each word line 218 can include a plurality of control gates (gate electrodes) at each memory cell 206 in respective row 220 and a gate line coupling the control gates.

Peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201. For instance, peripheral circuits 202 can read target memory cell

206 of memory cell array 201 by applying read voltage signals to word lines 218 that contains the data to be read, and sensing whether target memory cell 206 on word lines 218 are switched or not. Also, peripheral circuits 202 can write/program target memory cell 206 of memory cell array 201 by applying write voltage signals to word lines 218 that contains the data to be write. In addition, peripheral circuits 202 is configured to select or unselect each 3D NAND memory string 208 by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215. Peripheral circuits 202 can include various types of peripheral circuits formed using CMOS technologies. For instance, the peripheral circuit may include a 3D transistor and a high voltage transistor in accordance with some implementations of the present disclosure.

Figure 3:
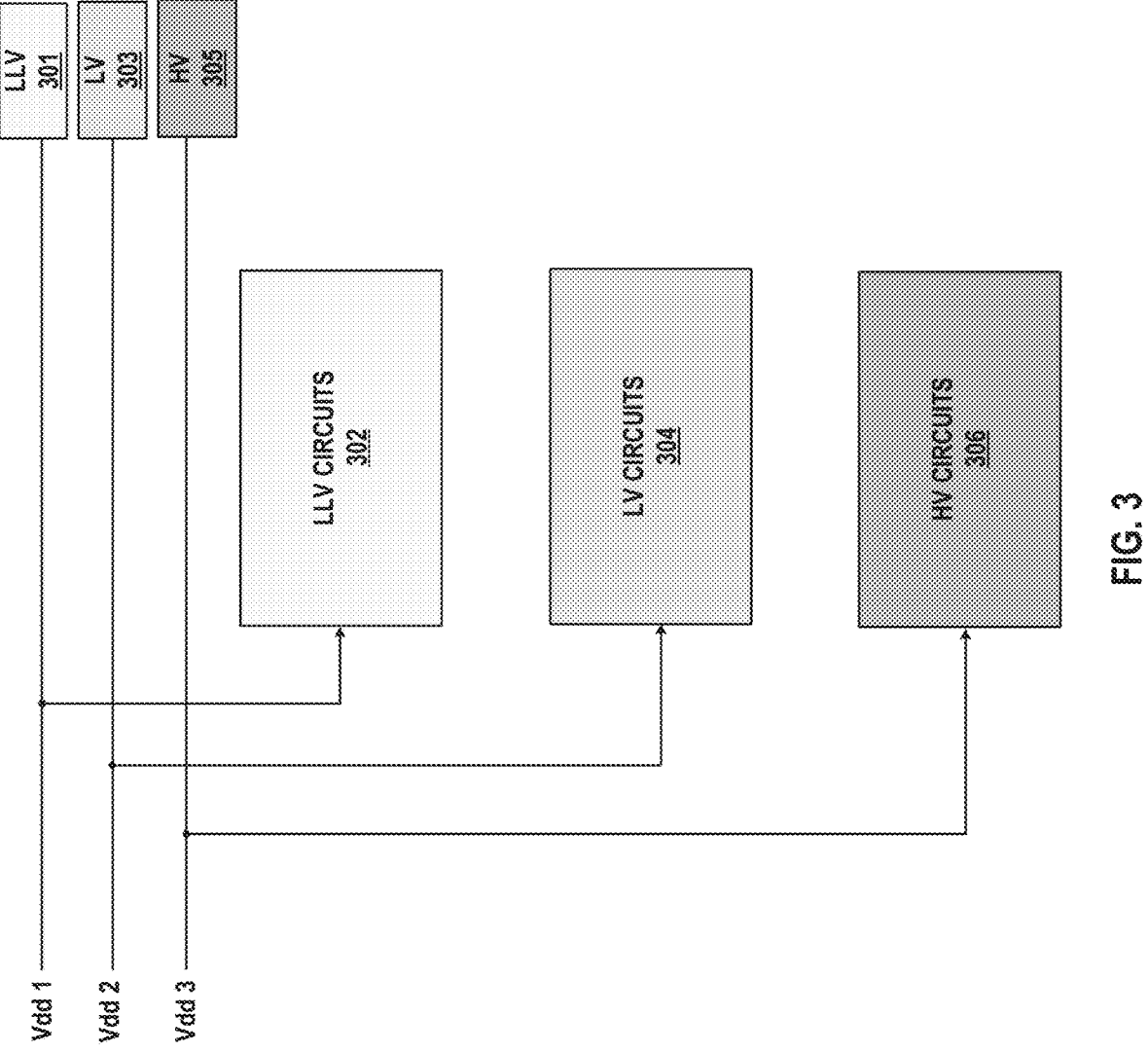
FIG. 3 illustrates a block diagram of peripheral circuits provided with various voltages, according to some aspects of the present disclosure.

Different from logic devices, memory devices, such as 3D NAND Flash memory, requires a wide range of voltages to be supplied to different memory peripheral circuits, including a higher voltage (e.g., 3.3 V or above) that is not suitable for logical devices (e.g., microprocessors) in particular using advanced CMOS technology nodes (e.g., sub-22 nm), but is needed for memory operations. For example, FIG. 3 illustrates a block diagram of peripheral circuits provided with various voltages, according to some aspects of the present disclosure. In some implementations, a peripheral circuit (e.g., peripheral circuit 202 in FIG. 2) in a memory device (e.g., memory device 200 in FIG. 2) includes a low low voltage (LLV) source 301, a low voltage (LV) source 303, and a high voltage (HV) source 305, each of which is configured to provide a voltage at a respective level (Vdd1, Vdd2, or Vdd3, where Vdd1<Vdd2<Vdd3). Each voltage source 301, 303, or 305 can receive a voltage input at a suitable level from an external power source (e.g., a battery). Each voltage source 301, 303, or 305 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail.

In some implementations, LLV source 301 is configured to provide a voltage between 0.9 V and 2.0 V (e.g., 0.9 V, 0.95 V, 1 V, 1.05 V, 1.1 V, 1.15 V, 1.2 V, 1.25 V, 1.3 V, 1.35 V, 1.4 V, 1.45V, 1.5V, 1.55V, 1.6 V, 1.65 V, 1.7 V, 1.75 V, 1.8 V, 1.85 V, 1.9 V, 1.95 V, any range bounded by the lower end by any of these values, or in any range defined by any two of these values). In one example, the voltage is 1.2 V. In some implementations, LV source 303 is configured to provide a voltage between 2 V and 3.3 V (e.g., 2 V, 2.1 V, 2.2 V, 2.3 V, 2.4 V, 2.5 V, 2.6 V, 2.7 V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV source 305 is configured to provide a voltage greater than 3.3 V. In one example, the voltage is between 5 V and 30 V (e.g., 5 V, 6 V, 7 V, 8 V, 9 V, 10 V, 11 V, 12 V, 13 V, 14 V, 15V, 16 V, 17 V, 18 V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV source 305, LV source 303, and LLV source 301 are for illustrative purposes and non-limiting, and any other suitable voltage ranges may be provided by HV source 305, LV source 303, and LLV source 301. Nevertheless, at least the voltage levels provided by LV source 303 and HV source 305 (e.g., 2 V and above) may not be suitable for the 3D transistors (e.g., fin field-effect transistor, aka FinFET) in logic devices using advanced CMOS technology nodes (e.g., sub-22 nm).

Based on their suitable voltage levels (Vdd1, Vdd 2, or Vdd3), the memory peripheral circuits (e.g., peripheral circuits 202) can be categories into LLV circuits 302, LV circuits 304, and HV circuits 306, which can be coupled to LLV source 301, LV source 303, and HV source 305, respectively. In some implementations, HV circuits 306 includes one or more drivers that are coupled to the memory cell array (e.g., memory cell array 201) through word lines, bit lines, SSG lines, DSG lines, source lines, etc., and configured to drive the memory cell array by applying a voltage at a suitable level to the word lines, bit lines, SSG lines, DSG lines, source lines, etc., when performing memory operations (e.g., read, program, or erase). In one example, HV circuit 306 may be sustainable to voltages in the range of, for example, 5 V and 30 V. In one example, HV circuit 306 may include a word line driver (not shown) that applies a program voltage (Vprog) or a pass voltage (Vpass) in the range of, for example, 5 V and 30 V, to word lines during program operations. In another example, HV circuit 306 may include a bit line driver (not shown) that applies an erase voltage (Veras) in the range of, for example, 5 V and 30 V, to bit lines during erase operations. In some implementations, LV circuits 304 includes a page buffer (not shown) configured to buffer the data read from or programmed to the memory cell array. For example, the page buffer may be provided with a voltage of, for instance, 3.3 V, by LV source 303. In some implementations, LLV circuits 302 include an I/O circuit (not shown) configured to interface the memory cell array with a memory controller. For example, the I/O circuit may be provided with a voltage of, for instance, 1.2 V, by LLV source 301.

At least one of LLV circuits 302, LV circuits 304, or HV circuits 306 can include 3D transistors disclosed herein. In some implementations, each of LLV circuits 302, LV circuits 304, and HV circuits 306 include 3D transistors. In one example, LLV circuit 302 may be sustainable to voltages in the range of, for example, 0.9 V and 2 V. In one example, LV circuit 304 may be sustainable to voltages in the range of, for example, 2 V and 3.3 V. In some implementations, each of LLV circuits 302 and LV circuits 304 include 3D transistors, while HV circuits 306 include planar circuits. Moreover, LLV circuits 302, LV circuits 304, or HV circuits 306 can be implemented with 3D transistors and/or planar transistors in any suitable combinations disclosed herein as peripheral circuits. In some implementations, 3D transistors may provide much better control of the channel and prevent leakage currents between the source and the drain when the gate is turned off. In addition, 3D transistors may reduce chip area and power consumption.

To address the challenges mentioned above, a semiconductor device 400 is provided, according to some aspects of the present disclosure. For example, semiconductor device 400 may be included in HV circuit 306 in FIG. 3. As shown in the plan view of semiconductor device 400, one or more HV transistors 401 are formed on a substrate 421 in FIG. 4A. HV transistors 401 may be separated or divided by one or more trench isolations 411 and one or more first doped regions 413 in the y-direction and/or in the x-direction. It is noted that x-, y-, and z-axes in figures hereinafter illustrate the spatial relationships of the components therein. For instance, substrate 421 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationship is applied throughout the present disclosure.

Trench isolations 411 are formed and extend in substrate 421 and configured to prevent electric current leakage between adjacent transistors or other semiconductor devices, for example, adjacent HV transistors 401.

First doped region 413 includes a p-type doped material. That is, first doped region 413 is doped with any suitable p-type dopant, such as boron (B) or Gallium (Ga). In some implementations, first doped region 413 is formed below trench isolation 411 and is configured to provide a high electrical resistance and prevent leakage path. The surface doping concentration of first doped regions 413 can be, for instance, $1 \times 10^{16}$ to $10^{19}$ cm$^{-3}$. The surface doping concentration of first doped region 413 can be, for instance, $1 \times 10^{16}$, $2 \times 10^{16}$, $3 \times 10^{16}$, $4 \times 10^{16}$, $5 \times 10^{16}$, $6 \times 10^{16}$, $7 \times 10^{16}$, $8 \times 10^{16}$, $9 \times 10^{16}$, $1 \times 10^{17}$, $2 \times 10^{17}$, $3 \times 10^{17}$, $4 \times 10^{17}$, $5 \times 10^{17}$, $6 \times 10^{17}$, $7 \times 10^{17}$, $8 \times 10^{17}$, $9 \times 10^{17}$, $1 \times 10^{18}$, $2 \times 10^{18}$, $3 \times 10^{18}$, $4 \times 10^{18}$, $5 \times 10^{18}$, $6 \times 10^{18}$, $7 \times 10^{18}$, $8 \times 10^{18}$, $9 \times 10^{18}$, or $1 \times 10^{19}$ cm$^{-3}$. In some implementations, first doped region 413 is an ion implantation region.

Figure 4A:
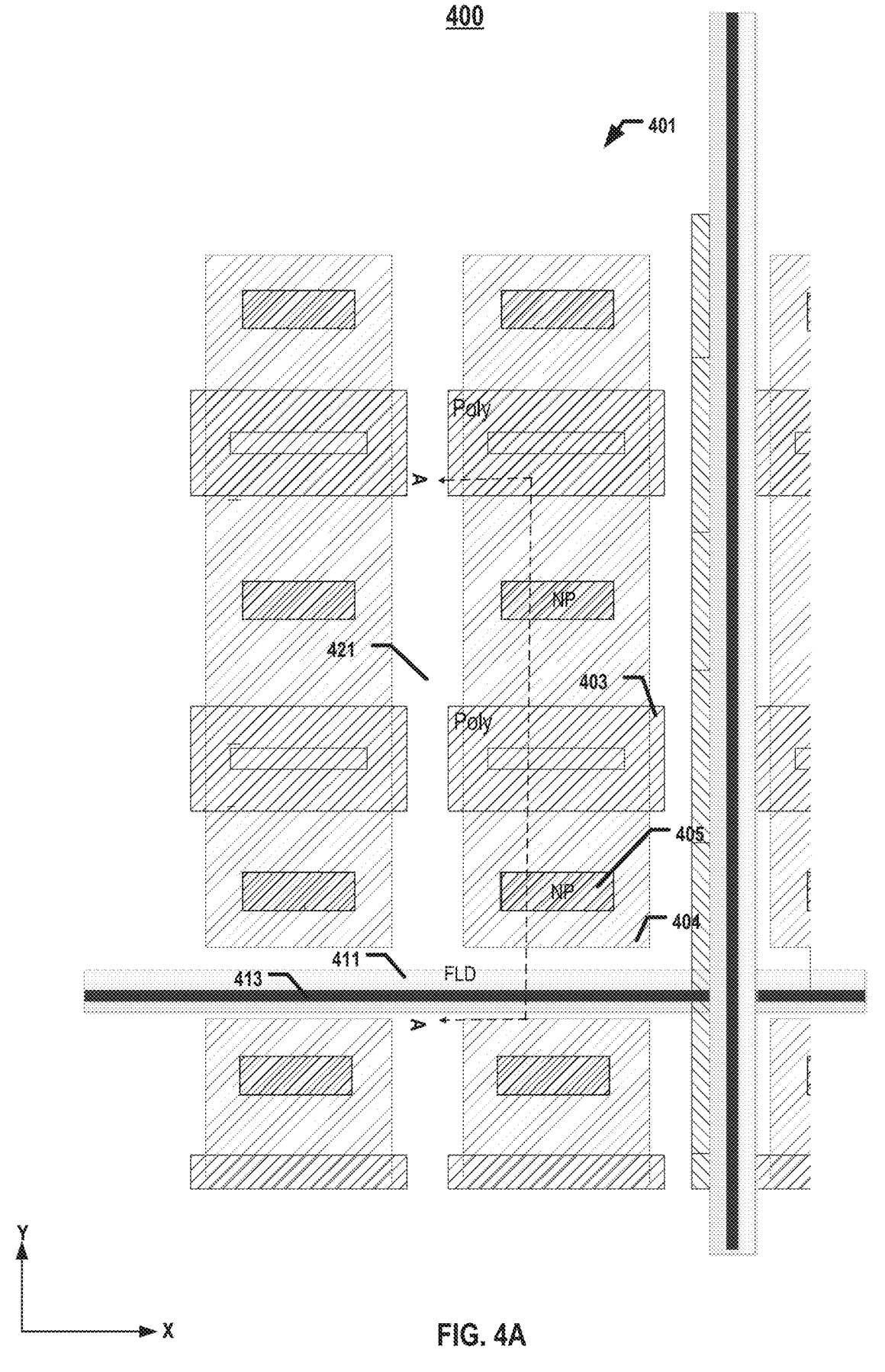
FIG. 4A illustrates a plan view of a semiconductor device, according to some aspects of the present disclosure.

HV transistor 401 may include one or more gate structures 403 formed between two of one or more second doped regions 405. In some implementations, HV transistor 401 may have two gates and three n-wells, as shown in FIG. 4A. In some implementations, the two gates are gate fingers which are electrically connected and connecting to a gate pad. Second doped region 405 includes an n-type doped material. That is, second doped region 405 is doped with any suitable n-type dopant, such as phosphorus (P) or arsenic (Ar). In some implementations, two second doped region 405 are configured to be n-wells of HV transistor 401. The surface doping concentration of second doped region 405 can be, for instance, $1 \times 10^{16}$ to $10^{19}$ cm$^{-3}$. The surface doping concentration of second doped region 405 can be, for instance, $1 \times 10^{16}$, $2 \times 10^{16}$, $3 \times 10^{16}$, $4 \times 10^{16}$, $5 \times 10^{16}$, $6 \times 10^{16}$, $7 \times 10^{16}$, $8 \times 10^{16}$, $9 \times 10^{16}$, $1 \times 10^{17}$, $2 \times 10^{17}$, $3 \times 10^{17}$, $4 \times 10^{17}$, $5 \times 10^{17}$, $6 \times 10^{17}$, $7 \times 10^{17}$, $8 \times 10^{17}$, $9 \times 10^{17}$, $1 \times 10^{18}$, $2 \times 10^{18}$, $3 \times 10^{18}$, $4 \times 10^{18}$, $5 \times 10^{18}$, $6 \times 10^{18}$, $7 \times 10^{18}$, $8 \times 10^{18}$, $9 \times 10^{18}$, or $1 \times 10^{19}$ cm$^{-3}$.

HV transistor 401 may further include a third doped region 404 formed below second doped region 405 and gate structure 403. Third doped region 404 includes a p-type doped material. That is, third doped region 404 is doped with any suitable p-type dopant, such as boron (B) or Gallium (Ga). In some implementations, third doped region 404 is configured to be a p-well of HV transistor 401. The surface doping concentration of third doped region 404 can be, for instance, $1 \times 10^{16}$ to $10^{19}$ cm'. The surface doping concentration of third doped region 404 can be, for instance, $1 \times 10^{16}$, $2 \times 10^{16}$, $3 \times 10^{16}$, $4 \times 10^{16}$, $5 \times 10^{16}$, $6 \times 10^{16}$, $7 \times 10^{16}$, $8 \times 10^{16}$, $9 \times 10^{16}$, $1 \times 10^{17}$, $2 \times 10^{17}$, $3 \times 10^{17}$, $4 \times 10^{17}$, $5 \times 10^{17}$, $6 \times 10^{17}$, $7 \times 10^{17}$, $8 \times 10^{17}$, $9 \times 10^{17}$, $1 \times 10^{18}$, $2 \times 10^{18}$, $3 \times 10^{18}$, $4 \times 10^{18}$, $5 \times 10^{18}$, $6 \times 10^{18}$, $7 \times 10^{18}$, $8 \times 10^{18}$, $9 \times 10^{18}$, or $1 \times 10^{19}$ cm$^{-3}$. In some implementations, third doped region 404 is formed by providing a p-doped substrate and bonding the p-doped substrate to substrate 421. Based on that second doped regions 405 are the n-wells of HV transistor 401, and third doped region 404 is the p-well of HV transistor 401, when HV transistor 401 is in an "on" state (i.e., a forward voltage is applied), it exhibits a resistive behavior between the drain and source terminals. That is, when the n-well and p-well are forward-biased, it allows current flow. And when HV transistor 401 is in an "off" state (i.e., a reversed voltage is applied), HV transistor 401 is equivalent to a PN diode or PIN diode. That is, when the n-well and the p-well are reverse-biased, the space-charge region extends principally on one of the doped sides, i.e., the n-well side. This PN junction under the "off" state may sustain the reversed bias between the drain and source terminals, act as an insulator, and do not permit current to flow. This PN junction structure is especially sustainable to high breakdown voltage.

Figure 4B:
FIG. 4B illustrates an enlarged plan view of the semiconductor device in FIG. 4A, according to some aspects of the present disclosure.

As mentioned above, though HV transistor 401 may sustain high breakdown voltage, trench isolations may become a bottleneck of the improvement of breakdown voltage. FIG. 4B illustrates an enlarged plan view of the semiconductor device in FIG. 4A, according to some aspects of the present disclosure. As shown in FIG. 4B, a space between the n-well (i.e., NP) region and the trench isolation (i.e., STIs), as well as the first doped regions (i.e., FLD) therebelow, creates a high electrical field when high reversed bias is applied to HV transistor 401. A distance of this space is a critical point of the breakdown voltage. In particular, the longer the distance can be, the higher the breakdown voltage the HV transistor can sustain. Since the width of the n-well of HV transistor 401 is not easily modified due to limited chip area, other solutions may be needed to increase the distance. Moreover, conventional lithography technology may not be able to achieve a width of FLD region to be less than 0.4 μm, or a distance between the NP region and the FLD region to be more than 0.6 μm, the disclosed technology, according to some aspects of the present disclosure, provides a fabrication method to improve such limitation. Therefore, by using the method according to the present disclosure, the distance between the NP region and the FLD region can be more than 0.6 μm, such as 0.6-0.8 μm, e.g., 0.61 μm, 0.62 μm, 0.63 μm, 0.64 μm, 0.65 μm, 0.66 μm, 0.67 μm, 0.68 μm, 0.69 μm, 0.70 μm, 0.71 μm, 0.72 μm, 0.73 μm, 0.74 μm, 0.75 μm, 0.76 μm, 0.77 μm, 0.78 μm, 0.79 μm, or 0.80 μm. In some implementations, the distance between the NP region and the STI can be more than 0.4 μm, such as 0.4-0.6 μm, e.g., 0.41 μm, 0.42 μm, 0.43 μm, 0.44 μm, 0.45 μm, 0.46 μm, 0.47 μm, 0.48 μm, 0.49 μm, 0.50 μm, 0.51 μm, 0.52 μm, 0.53 μm, 0.54 μm, 0.55 μm, 0.56 μm, 0.57 μm, 0.58 μm, 0.59 μm, or 0.60 μm.

Figure 4C:
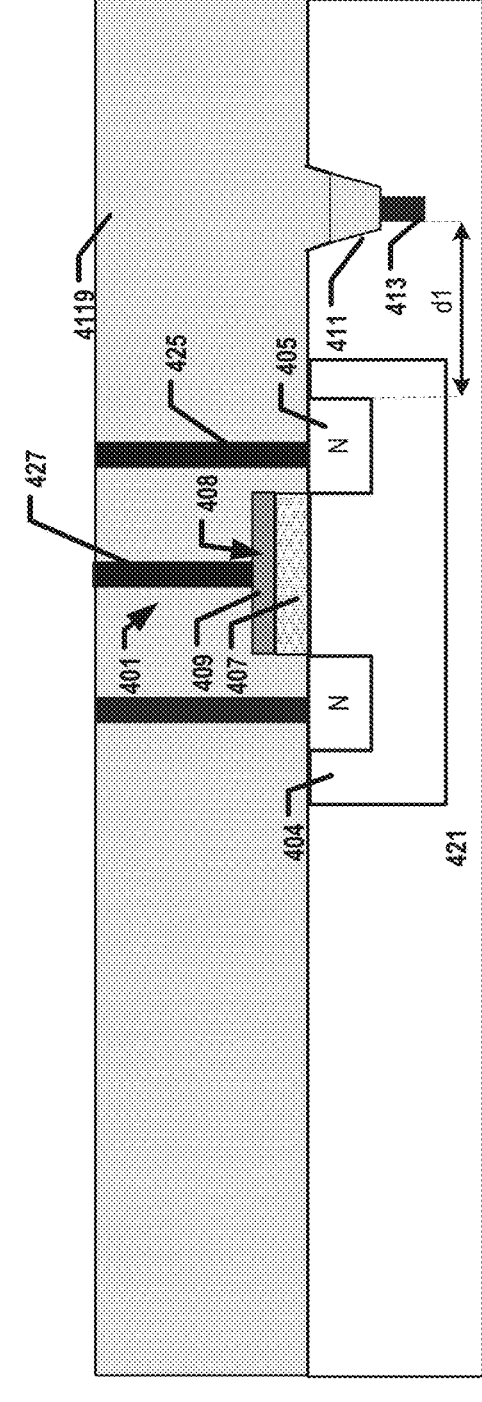
FIG. 4C illustrates a side view of a cross-section of the semiconductor device in FIG. 4A, according to some aspects of the present disclosure.
Figure 4C:
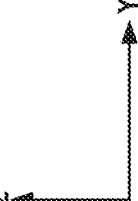

FIG. 4C illustrates a side view of a cross-section of semiconductor device 400 along the AA plane in FIG. 4A, according to some aspects of the present disclosure. As shown in FIG. 4C, semiconductor device 400 includes a substrate 421, HV transistor 401 formed on substrate 421, first trench isolation 411 formed beside HV transistor 401 and configured to prevent leakage path between HV transistor 401 and adjacent transistors, and first doped region 413 formed below first trench isolation 411. Semiconductor device 400 may further include an interlayer dielectric (ILD) 4119 formed above substrate 421 and covering top surfaces of HV transistor 401 and first trench isolation 411.

HV transistor 401 may include third doped region 404 formed in and extending into substrate 421 in the z-direction, second doped region 405 formed in third doped region 404 of substrate 421, and a first gate structure 408 formed on substrate 421 extending vertically (i.e., in the z-direction) and between two second doped region 405 laterally (i.e., in the y-direction). First gate structure 408 includes a first gate dielectric 407 formed on third doped region 404 of substrate 421, and a first gate electrode 409 formed on first gate dielectric 407. HV transistor 401 may further include first electrodes 425 formed on and electrically connected to respective second doped regions 405, and a second electrode 427 formed on and electrically connected to first gate electrode 409.

Substrate 421 can include silicon (e.g., single crystalline silicon, c-Si), silicon germanium (SiGe), gallium arsenide (GaAs), germanium (Ge), silicon on insulator (SOI), or any other suitable materials. In some implementations, substrate 421 includes a Si substrate. First gate dielectric 407 can include any suitable dielectric materials, such as silicon oxide, silicon nitride, silicon oxynitride, or high-k dielectrics (e.g., aluminum oxide, hafnium oxide, zirconium oxide, etc.). In some implementations, first gate dielectric 407 includes silicon oxide, i.e., a gate oxide. First gate electrode 409 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, first gate electrode 409 includes doped polysilicon, i.e., a gate poly. Interlayer dielectric 4119 may include any suitable dielectric materials, such as silicon oxide, silicon nitride, silicon oxynitride, or high-k dielectrics (e.g., aluminum oxide, hafnium oxide, zirconium oxide, etc.). In some implementations, interlayer dielectric 4119 includes silicon oxide. First electrode 425 and second electrode 427 may include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, first electrode 425 and second electrode 427 include tungsten.

First trench isolation 411 is formed and extending into substrate 421 vertically (i.e., in the z-direction) also formed beside HV transistor 401 to isolate HV transistor 401 from adjacent transistors and prevent leakage path passing through. Trench isolations (e.g., first trench isolation 411), can be shallow trench isolation (STI). These STIs can be formed in or on substrate 421 and between adjacent transistors or other semiconductor devices to reduce current leakage. Trench isolations (e.g., first trench isolation 411) can include any suitable dielectric materials, such as silicon oxide, silicon nitride, silicon oxynitride, or high-k dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, a material of first trench isolation 411 includes silicon oxide. In some implementations, first trench isolation 411 can be a thinned trench isolation. That is, a top surface of thinned trench isolation 411 is lower than a top surface of substrate 421

First doped region 413 is formed below first trench isolation 411 and has a width in a lateral direction (e.g., in the y-direction) of equal to or less than 0.2 And a distance dl, as shown in FIG. 4C, in a lateral direction (e.g., in the y-direction) between second doped region 405 and first doped region 413 is equal to or more than 0.6 μm, or even 0.7 μm. The reduced width of first doped region 413 and increased distance between second doped region 405 and first doped region 413 may significantly improve the breakdown voltage of HV transistor 401. It is noted that the distance herein refers to a nearest part of a region to a nearest part of another region.

Figure 4D:
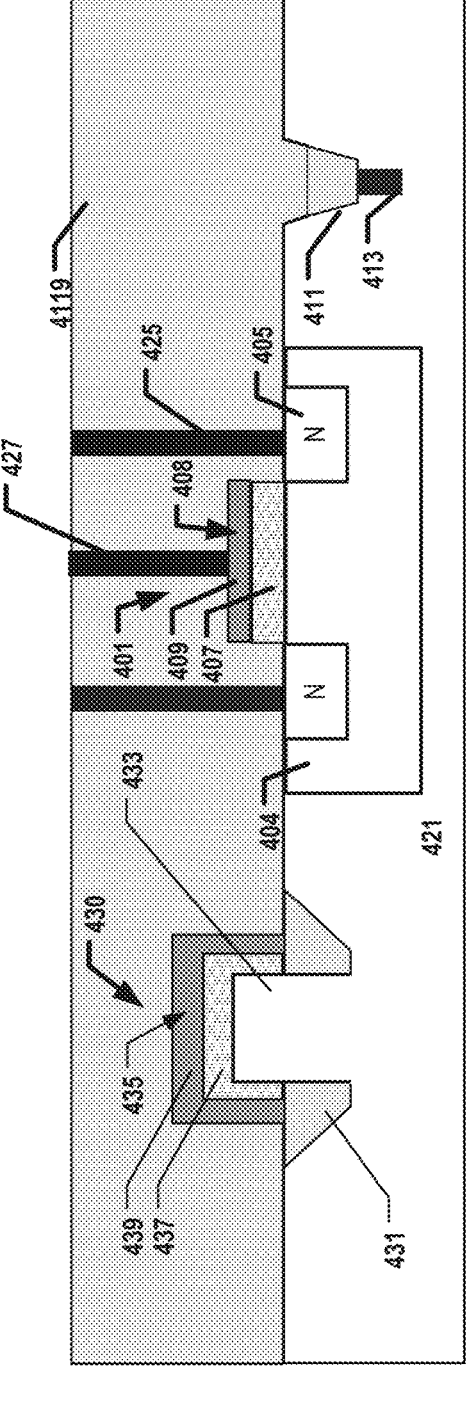
FIG. 4D illustrates a side view of a cross-section of a semiconductor device, according to some aspects of the present disclosure.
Figure 4D:
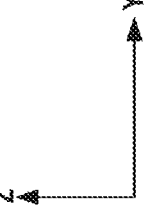

FIG. 4D illustrates a side view of a cross-section of another semiconductor device 420, according to some aspects of the present disclosure. Semiconductor device 420 is similar to semiconductor device 400 except a 3D transistor 430 formed on substrate 421. For ease of description, the other components in semiconductor device 420 that are identical to those in semiconductor device 400 can be referred to as descriptions in FIG. 4C. As shown in FIG. 4D, semiconductor device 420 may include 3D transistor 430 formed on substrate 421. 3D transistor 430 may be included in LLV circuits 302 or LV circuits 304 in accordance with some implementations of the present disclosure. It is noted that, though 3D transistor 430 is illustrated in a z-y plane as in FIG. 4D and arranged side by side with HV transistor 401 and first trench isolation 411, it is not necessarily to be arranged in such a way. For instance, 3D transistor 430 can be rotated 90 degrees or at other orientations, or 3D transistor 430 can be arranged in a remote end of substrate 421 or even another substrate 421 but in the same wafer (not shown).

Figures 4F, 4G:
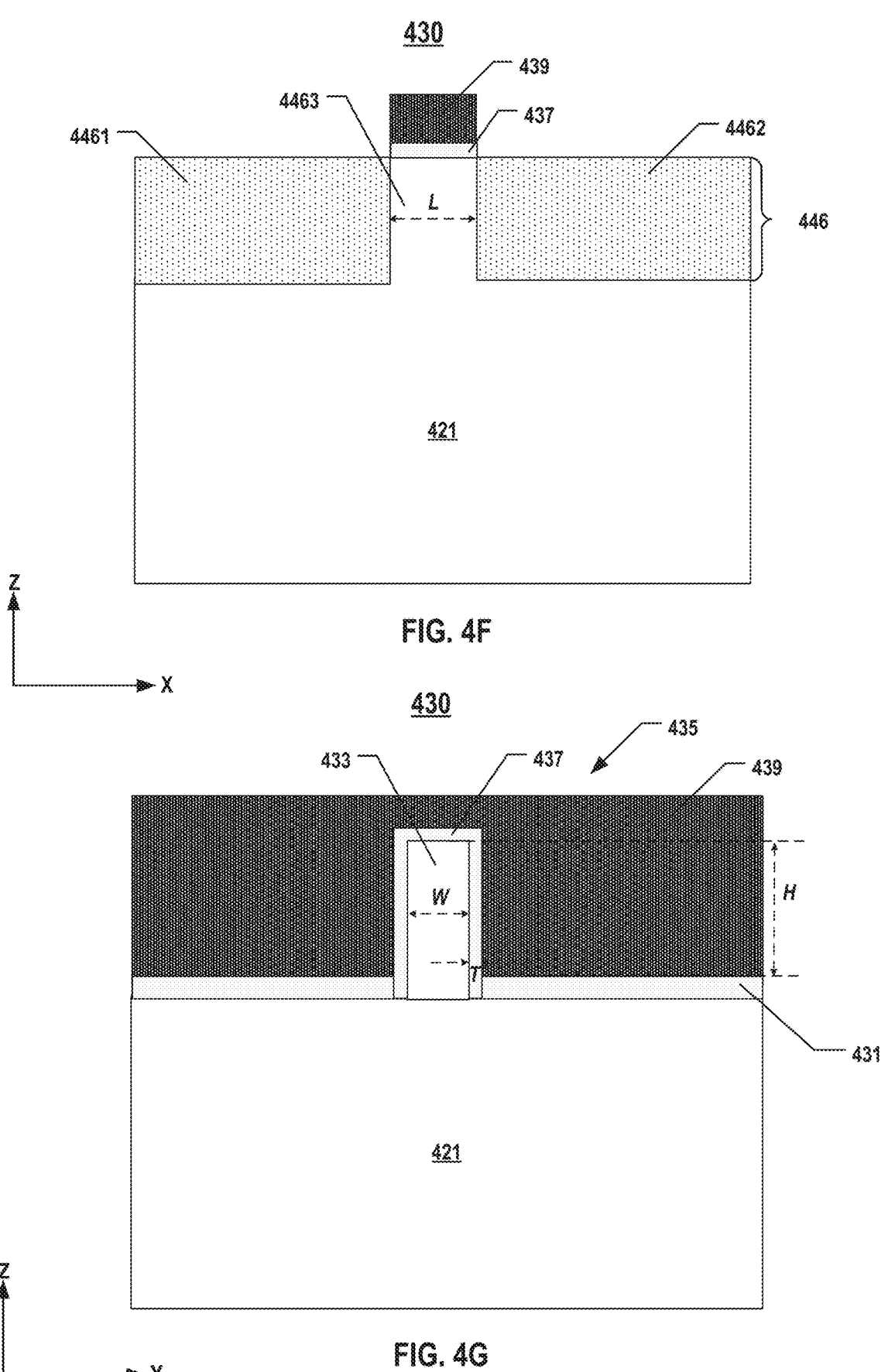
FIGS. 4F and 4G illustrate side views of two cross-sections of the 3D transistor in FIG. 4E, according to some aspects of the present disclosure.

3D transistor 430 can also be illustrated in FIGS. 4E-4G. FIG. 4D and FIGS. 4E-4G will be discussed together. As shown in FIG. 4E, 3D transistor 430 may include a 3D semiconductor body 446 having a source 4461, a drain 4462, and an active region 4463 formed between source 4461 and drain 4462. 3D semiconductor body 446 is partially formed in a second recess 436 extending through second trench isolation 431 in the z-direction. That is, at least a portion of 3D semiconductor body 446 (i.e., bottom portions of 3D semiconductor body 446) is surrounded by second trench isolation 431. In some implementations, 3D transistor 430 further includes gate structure 435 in contact with a portion of substrate 433 (e.g., corresponding to active region 4463). Gate structure 435 may include a second gate dielectric 437 and a second gate electrode 439 formed on second gate dielectric 437. The portion of substrate 433 is surrounded by source 4461 and drain 4462 in the x-direction and surrounded by second trench isolation 431 in the y-direction. 3D semiconductor body 446 at least partially extends above the top surface of substrate 421 to expose not only the top surface but also the two side surfaces of 3D semiconductor body 446. As shown in FIG. 4E, for example, 3D semiconductor body 446 may be in a 3D structure, which is also known as a "fin," to expose three sides thereof. Also, 3D semiconductor body 446 may extend through second trench isolation 431 and may be at least partially surrounded by second trench isolation 431 on two sides in the y-direction. In some implementations, 3D semiconductor body 446 is formed from substrate 421. In some implementations, 3D semiconductor body 446 includes single crystalline silicon. Source 4461 and drain 4462 can be doped with any suitable P-type dopants, such as boron (B) or Gallium (Ga), or any suitable N-type dopants, such as phosphorus (P) or arsenic (Ar). Source 4461 and drain 4462 can be separated by gate structure 435 in the plan view. In other words, gate structure 435 is formed between source 4461 and drain 4462 in the plan view, according to some implementations. The channel of 3D transistor 430 in substrate 421 can be formed laterally between source 4461 and drain 4462 under gate structure 435 when a gate voltage applied to second gate electrode 439 of gate structure 435 is above the threshold voltage of 3D transistor 430. As shown in FIG. 4E, gate structure 435 can be above and in contact with the portion of substrate 433 in which the channel can be formed (i.e., active region 4463). That is, gate structure 435 is in contact with three sides of active region 4463, i.e., in the top plane of the portion of substrate 433, and two lateral planes of the portion of substrate 433, according to some implementations. And the portion of substrate 433 is surrounded by gate structure 435 in the y-direction, and source 4461 and drain 4462 on another two sides in the x-direction. It is understood, although not shown in FIGS. 4E-4G, 3D transistor 430 may include additional components, such as wells and spacers.

Second gate dielectric 437 can include any suitable dielectric materials, such as silicon oxide, silicon nitride, silicon oxynitride, or high-k dielectrics (e.g., aluminum oxide, hafnium oxide, zirconium oxide, etc.). In some implementations, second gate dielectric 437 includes silicon oxide, i.e., a gate oxide. Second gate electrode 439 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, second gate electrode 439 includes doped polysilicon, i.e., a gate poly.

Second trench isolation 431 is formed and extending into substrate 421 vertically (i.e., in the z-direction). Second trench isolation 431 can include any suitable dielectric materials, such as silicon oxide, silicon nitride, silicon oxynitride, or high-k dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, a material of second trench isolation 431 includes silicon oxide. In some implementations, a depth of second recess 436 is substantially the same as a depth between the top surface of substrate 421 and the top surface of thinned trench isolation 411.

FIGS. 5A-5F illustrate a fabrication process for forming a semiconductor device 500 (corresponding to semiconductor device 400 in FIG. 4C), according to some aspects of the present disclosure. FIG. 7 illustrates a flowchart of a method 700 for forming an exemplary semiconductor device (corresponding to semiconductor device 400 in FIG. 4C), according to some aspects of the present disclosure. It is understood that the operations shown in method 700 are not exhaustive and those other operations can be performed as well before, after, or between any of the illustrated operations. Further, some of the operations may be performed simultaneously, or in a different order than shown in FIGS. 5A-5F and FIG. 7 will be described together.

Figure 5A:
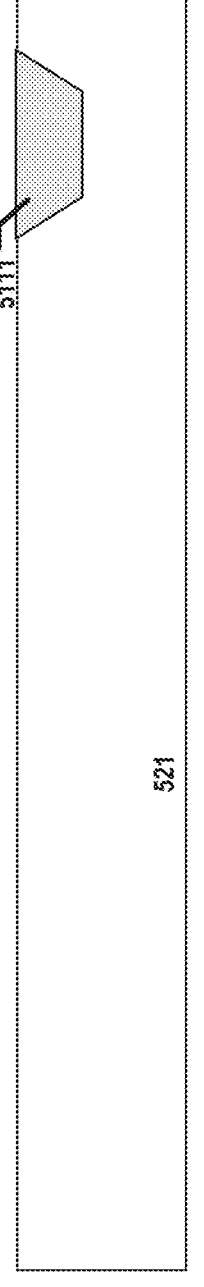
Figure 5A:

Referring to FIG. 7, method 700 starts at operation 702, in which a sacrificial first trench isolation is formed in a substrate. For example, as illustrated in FIG. 5A, sacrificial first trench isolation 5111 is formed in substrate 521 (corresponding to 421 in FIG. 4C). In some implementations, sacrificial first trench isolation 5111 can be an STI and is formed in substrate 521, for example, using wet/dry etch and thin film deposition of silicon oxide. The top surface of sacrificial first trench isolation 5111 can be planarized using, for example, chemical mechanical polishing (CMP). Sacrificial first trench isolation 5111 can divide substrate 521 into multiple regions in which multiple transistors can be formed, respectively. In some implementations, sacrificial first trench isolation 5111 is formed by etching substrate 521 to form a first trench recess (not shown). After forming the first trench recess, an oxide layer (not shown) is deposited covering substrate 521 and in the first trench recess. Next, the oxide layer covering substrate 521 is removed and the oxide layer in the first trench recess is left to form sacrificial first trench isolation 5111. In some implementations, removing the oxide layer covering substrate 521 includes applying a CMP over the oxide layer to remove the oxide layer covering substrate 521.

As mentioned above, to form an FLD region under trench isolation, a mask layer with a hole pattern should be provided to form the FLD region. However, due to the critical dimension (CD) of forming the hole pattern of the mask layer (e.g., a minimum diameter of the hole is about 0.36 μm), the width of the FLD region cannot be less than 0.4 μm. Therefore, the process of fabricating the trench isolation and the FLD region in the present disclosure provides solutions to address this challenge.

Figure 5B:
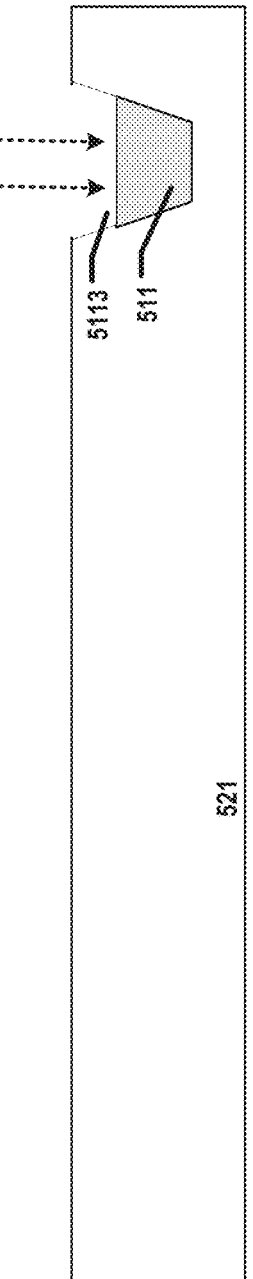
Figure 5B:

Method 700 proceeds to operation 704, as illustrated in FIG. 7, in which the sacrificial first trench isolation is etched back to form a first recess and a first trench isolation. For example, as illustrated in FIG. 5B, sacrificial first trench isolation 5111 is etched back to form a first recess 5113 and a first trench isolation 511 using lithography and wet/dry etch. First recess 5113 is formed on first trench isolation 511. In some implementations, first trench isolation 511 is a thinned trench isolation 411 as in FIG. 4C.

Next, method 700 proceeds to operation 706, as illustrated in FIG. 7, in which a mask layer having a hole is formed over the first recess and the first trench isolation. For example, as illustrated in FIG. 5C, a mask layer 5115 having a hole 5117 is formed over first recess 5113 and first trench isolation 511. In some implementations, mask layer 5115 includes a photoresist layer. Mask layer 5115 with hole 5117 is configured to be used to ion implant an FLD region under first trench isolation 511 as discussed above. And because the thickness of first trench isolation 511 is reduced, the less power to ion implant to form the FLD region is required. Therefore, the thickness of mask layer 5115 in first recess 5113 and the dimension (e.g., the critical dimension) of hole 5117 can also be reduced. It is noted that the dimension (e.g., the critical dimension) of hole 5117 is reduced because when mask layer 5115 (e.g., a photoresist material) is formed in a recess (e.g., first recess 5113), after being exposed to an ultraviolet light and developed, the remaining mask can have a pattern smaller than expected. In addition, by using the thinned first trench isolation 511, the energy of ion implantation to penetrate STI is reduced, thereby reducing the thickness of mask layer 5115 that in compatible with the energy of ion implantation. For instance, to penetrate a 0.5 μm STI to form the FLD region, it is required to have a 210 keV energy with corresponding 5 μm photoresist layer such that a minimum critical dimension of the hole is limited to 0.36 μm. By using the thinned first trench isolation 511, since the STI is thinned to, for instance, 0.3 μm, the energy of ion implantation can be reduced to 180 keV with corresponding 3 μm photoresist layer such that a minimum critical dimension of the hole is reduce to 0.2 μm or less. With reduced hole dimension, thinned mask layer, and thinned trench isolation, it not only allows less power to ion implant to form the FLD region but also reduces the width of the FLD region to a limit that existing lithography technologies cannot achieve.

Next, method 700 proceeds to operation 708, as illustrated in FIG. 7, in which a first doped region below the first trench isolation is formed by ion implantation. For example, as illustrated in FIG. 5C, first doped region 513 with reduced width is formed by ion implanting via hole 5117 of mask layer 5115 and through first trench isolation 511. The width of first doped region 513 can be equal to or less than 0.2 μm. First doped region 513 can be doped with any suitable p-type dopant, such as B or Ga. The power of the ion implantation can be, for instance, 150 to 270 keV. In some implementations, mask layer 5115 may be lifted off after the ion implantation.

Figure 5D:
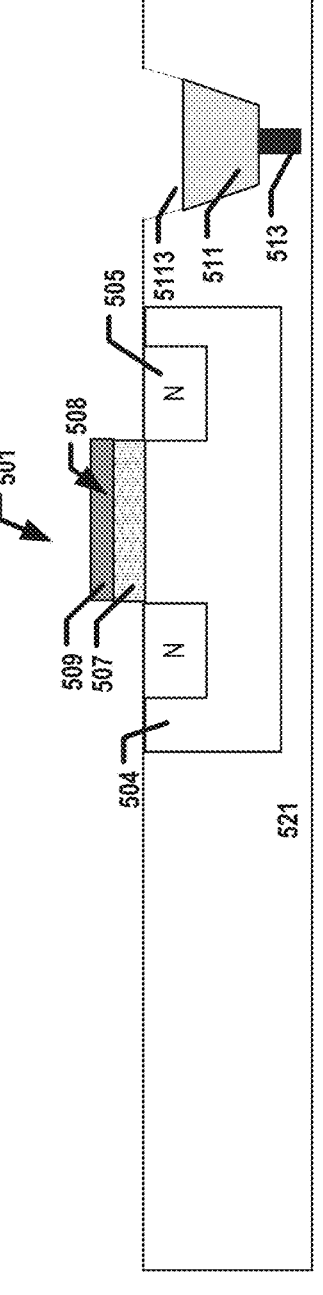
Figure 5D:
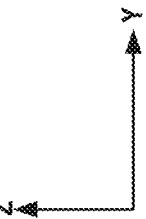

Next, method 700 proceeds to operation 710, as illustrated in FIG. 7, in which two second doped regions are formed in the substrate. For example, as illustrated in FIG. 5D, two second doped regions 505 are formed in substrate 521 by any suitable doping techniques such as ion implantation. Second doped regions 505 can be doped with any suitable n-type dopant, such as P or Ar. In some implementations, two second doped regions 505 are formed in a third doped region 504 of substrate 521. Third doped region 504 may be formed in substrate 521 by any suitable doping techniques such as ion implantation. Third doped region 504 can be doped with any suitable p-type dopant, such as B or Ga.

Next, method 700 proceeds to operation 712, as illustrated in FIG. 7, in which a first gate structure is formed on the substrate and between the two second doped regions. For example, as illustrated in FIG. 5D, a first gate structure 508 is formed on third doped region 504 of substrate 521 and between two second doped regions 505. First gate structure 508 includes a first gate dielectric 507 formed on third doped region 504 of substrate 521 and a first gate electrode 509 formed on first gate dielectric 507. The HV transistor 501 (corresponding to HV transistor 401 in FIG. 4C) is formed thereafter. In some implementations, second doped regions 505 are n-wells of HV transistor 501 and third doped region 504 is p-well of HV transistor 501. After the processes, a distance in a lateral direction (e.g., in the y-direction) between second doped region 505 and first doped region 513 can be equal to or more than 0.6 μm, or even more than 0.7 μm. The increased distance between second doped region 505 and first doped region 513 may significantly improve the breakdown voltage of HV transistor 501. In some implementations, multiple first doped region 513 may be formed in first trench isolation 511. And at least two of first doped region 513 may have different width.

Figure 5E:
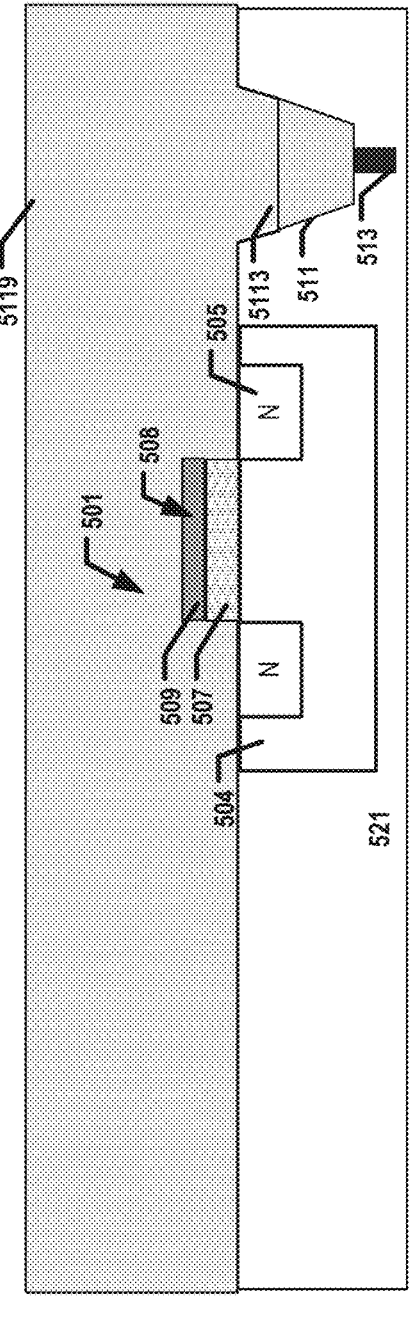
Figure 5E:
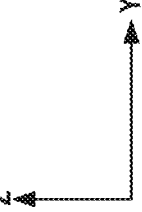
Figure 5F:
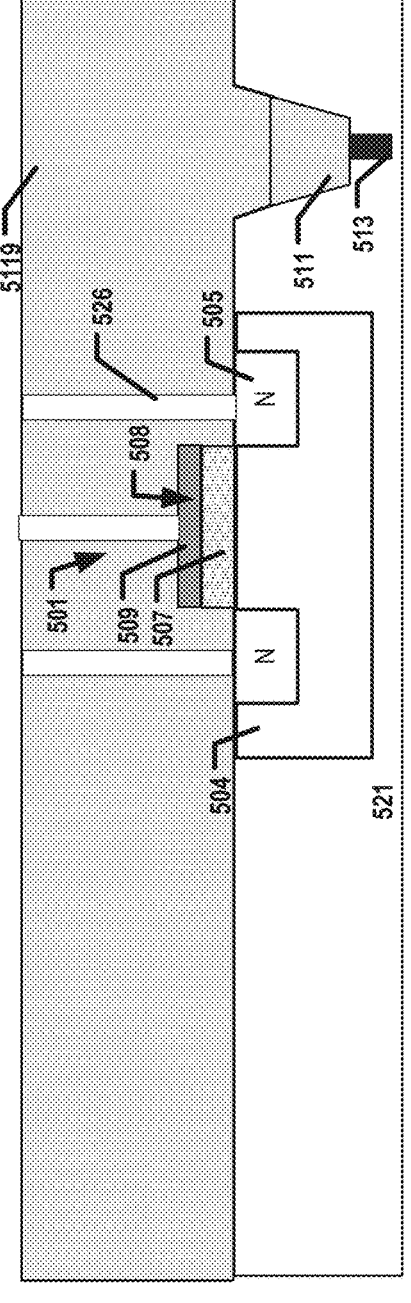

Next, method 700 proceeds to operation 714, as illustrated in FIG. 7, in which an interlayer dielectric is formed on the substrate covering the HV transistor and first trench isolation and filling the first recess. For example, as illustrated in FIG. 5E, interlayer dielectric 5119 is formed on substrate 521 covering HV transistor 501 and first trench isolation 511 and filling up first recess 5113. In some implementations, interlayer dielectric 5119 can include any suitable dielectric materials, such as silicon oxide, silicon nitride, silicon oxynitride, or high-k dielectrics (e.g., aluminum oxide, hafnium oxide, zirconium oxide, etc.). In some implementations, interlayer dielectric 5119 can include a same material as first trench isolation 511. Interlayer dielectric 5119 can be deposited using one or more thin film deposition processes including, but not limited to, chemical vapor deposition (CVD), physical vapor deposition (PVD), atomic layer deposition (ALD), or any combination thereof. Furthermore, after forming interlayer dielectric 5119, as illustrated in FIG. 5F, a wet/dry etching can be applied to interlayer dielectric 5119 to form contact holes 526 extending through interlayer dielectric 5119 in the z-direction to expose second doped region 505 and first gate electrode 509. Contact holes 526 are then filled up with electrode materials to form first electrode 425 and second electrode 427 as in FIG. 4C.

FIGS. 6A-6F illustrate a fabrication process for forming a semiconductor device 600 (corresponding to semiconductor device 420 in FIG. 4D), according to some aspects of the present disclosure. FIG. 8 illustrates a flowchart of a method 800 for forming an exemplary semiconductor device (corresponding to semiconductor device 420 in FIG. 4D), according to some aspects of the present disclosure. It is understood that the operations shown in method 800 are not exhaustive and any other operations can be performed as well before, after, or between any of the illustrated operations. Further, some of the operations may be performed simultaneously, or in a different order than shown in FIGS. 6A-6F and FIG. 8 will be described together.

Figure 6A:
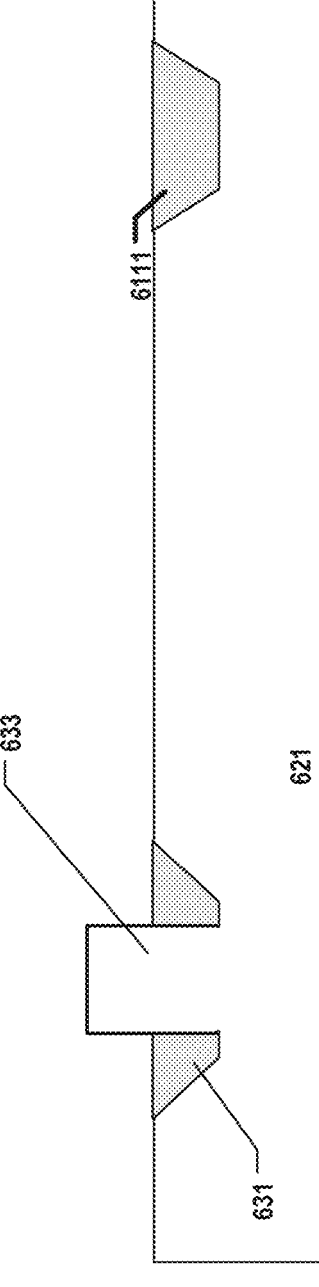
Figure 6A:
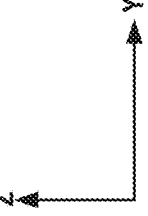

Referring to FIG. 8, method 800 starts at operation 802, in which a sacrificial first trench isolation is formed in a substrate, and a second trench isolation is formed in the substrate surrounding a portion of the substrate. For example, as illustrated in FIG. 6A, sacrificial first trench isolation 6111 is formed in substrate 621 (corresponding to 421 in FIG. 4D). In some implementations, sacrificial first trench isolation 6111 and second trench isolation 631 can be STIs and are formed in substrate 621, for example, using wet/dry etch and thin film deposition of silicon oxide. The top surface of sacrificial first trench isolation 6111 and second trench isolation 631 can be planarized using, for example, chemical mechanical polishing (CMP). In some implementations, sacrificial first trench isolation 6111 can divide substrate 621 into multiple regions in which multiple transistors can be formed, respectively. A second trench isolation 631 is formed in substrate 621 surrounding a portion of substrate 633. The portion of substrate 633 is defined by second trench isolation 631 and can be the active area of the 3D transistor, which will be discussed later.

In some implementations, forming the sacrificial first trench isolation (e.g., 6111) in the substrate (e.g., 621) includes etching the substrate to form a first trench recess (not shown). Next, a first oxide layer (not shown) is formed covering the substrate and in the first trench recess. And then, the first oxide layer covering the substrate is removed and the first oxide layer is left in the first trench recess to form the sacrificial first trench isolation. In some implementations, forming the second trench isolation (e.g., 631) in the substrate surrounding the protruding portion (e.g., the portion of the substrate) on the substrate includes etching the substrate to form a second trench recess (not shown) surrounding the protruding portion. Next, a second oxide layer is formed covering the protruding portion and in the second trench recess. And then, the second oxide layer covering the protruding portion is removed and the second oxide layer in the second trench recess is left to form the second trench isolation.

In one implementation, as shown in FIGS. 6G, etching the second trench isolation (e.g., 631 in FIG. 6G) to form the second recess (e.g., 636 in FIG. 6G) in the second trench isolation includes etching the second trench isolation to expose a top surface of the substrate (e.g., 621 in FIG. 6G). The second recess (e.g., 636 in FIG. 6G) is at least partially surrounded by the second trench isolation (e.g., 631), as shown in FIG. 6G. After that, a source (e.g., source 4461 in FIG. 6H, which corresponds to FIG. 4E), a drain (e.g., drain 4462 in FIG. 6H, which corresponds to FIG. 4E) can be formed on two sides of portion of substrate 433. The 3D semiconductor body (i.e., 3D semiconductor body 446 in FIG. 6H, which corresponds to FIG. 4E) is formed thereafter. It is noted that the gate structure (e.g., 435 and 635 in FIGS. 6G and 6H) can be formed before forming the second recess or after forming the second recess.

In another implementation, as shown in FIGS. 6I and 6J, etching the second trench isolation (e.g., 431 in FIG. 6J, which corresponding to FIG. 4E) to form the second recess (e.g., 6313 in FIG. 6J.) in the second trench isolation includes etching back a sacrificial second trench isolation (e.g., 6311 in FIG. 6I) to expose sidewalls of the 3D semiconductor body (i.e., 3D semiconductor body 446 in FIG. 6J) and thus form a thinned second trench isolation (e.g., 431 in FIG. 6J). In some implementations, the sacrificial second trench isolation (e.g., 6313 in FIG. 6I) is etched back from a same height of the portion of substrate (e.g., 633 in FIG. 6I), to a height lower than portion of substrate 433. as shown in the second trench isolation 431 of FIG. 6J. It is noted that the gate structure (e.g., 435 and 635 in FIGS. 6I and 6J) can be formed before forming the second recess or after forming the second recess.

As mentioned above, to form an FLD region under trench isolation, a mask layer with a hole pattern should be provided to form the FLD region. However, due to the critical dimension (CD) of forming the hole pattern of the mask layer (e.g., a minimum diameter of the hole is about 0.36 μm), the width of the FLD region cannot be less than 0.4 μm. Therefore, the process of fabricating the trench isolation and the FLD region in the present disclosure provides solutions to address this challenge.

Figure 6B:
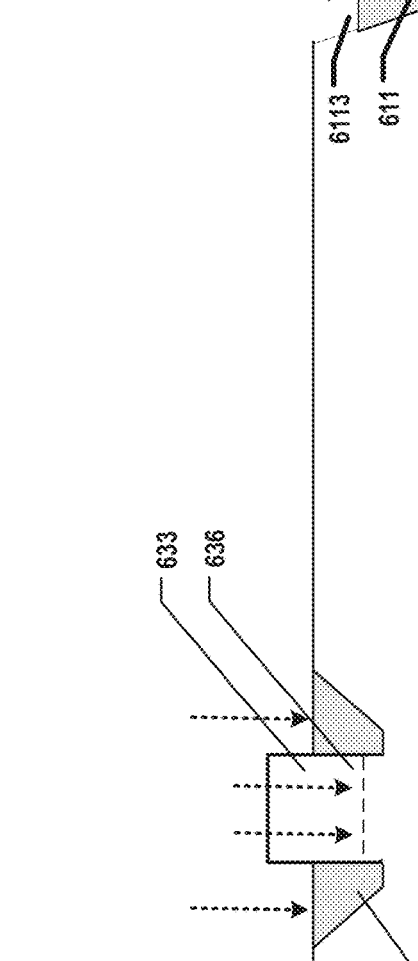
Figure 6B:

Method 800 proceeds to operation 804, as illustrated in FIG. 8, in which the sacrificial first trench isolation is etched back to form a first recess and a first trench isolation, and the second trench isolation is also etched back to form a second recess in the second trench isolation. For example, as illustrated in FIG. 6B, sacrificial first trench isolation (i.e., 6111 as in FIG. 6A) is etched back to form a first recess 6113 and a first trench isolation 611 using lithography and wet/dry etch. First recess 6113 is formed on first trench isolation 611. In some implementations, first trench isolation 611 is a thinned trench isolation 411 as in FIG. 4D. In the same etching process, second trench isolation 631 is etched back to form second recess 636 (though it is not shown in the cross-section as in FIG. 6B, it can be shown as second recess 436 in FIG. 4E). In some implementations, a depth of first recess 6113 is the same or similar to a depth of second recess 636 since they are formed in the same etching process.

Figure 6C:
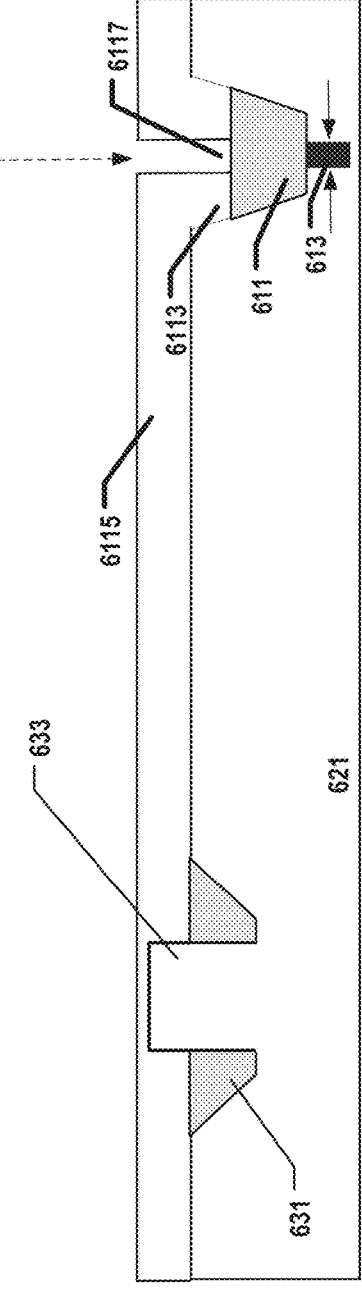
Figure 6C:
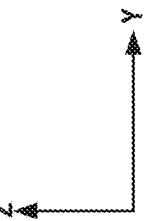

Next, method 800 proceeds to operation 806, as illustrated in FIG. 8, in which a mask layer having a hole is formed over the first recess and the first trench isolation. For example, as illustrated in FIG. 6C, a mask layer 6115 having a hole 6117 is formed over first recess 6113 and first trench isolation 611. In some implementations, mask layer 6115 includes a photoresist layer. Mask layer 6115 with hole 6117 is configured to be used to ion implant an FLD region (i.e., a first doped region 613) under first trench isolation 611 as discussed above. And because the thickness of first trench isolation 611 is reduced, the thickness of mask layer 6115 and the dimension of hole 6117 is also reduced. With reduced hole dimension, thinned mask layer, and thinned trench isolation, it not only allows less power to ion implant to form the FLD region but also reduces the width of the FLD region to a limit that existing lithography technologies cannot achieve.

Next, method 800 proceeds to operation 808, as illustrated in FIG. 8, in which a first doped region below the first trench isolation is formed by ion implantation. For example, as illustrated in FIG. 6C, first doped region 613 with reduced width is formed by ion implanting via hole 6117 of mask layer 6115 and through first trench isolation 611. The width of first doped region 613 can be equal to or less than 0.2 μm. First doped region 613 can be doped with any suitable p-type dopant, such as B or Ga. The power of the ion implantation can be, for instance, 150 to 270 keV. In some implementations, mask layer 6115 may be lifted off after the ion implantation.

Figure 6D:
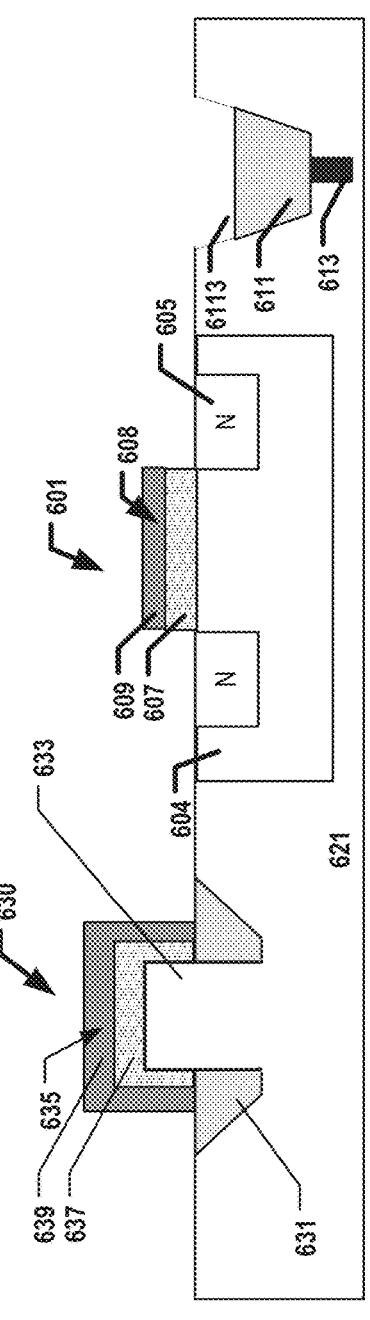
Figure 6D:
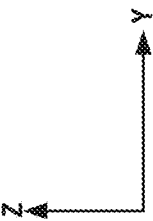

Next, method 800 proceeds to operation 810, as illustrated in FIG. 8, in which two second doped regions are formed in the substrate. For example, as illustrated in FIG. 6D, two second doped regions 605 are formed in substrate 621 by any suitable doping techniques such as ion implantation. Second doped regions 605 can be doped with any suitable n-type dopant, such as P or Ar. In some implementations, two second doped regions 605 are formed in a third doped region 604 of substrate 621. Third doped region 604 may be formed in substrate 621 by any suitable doping techniques such as ion implantation. Third doped region 604 can be doped with any suitable p-type dopant, such as B or Ga.

Next, method 800 proceeds to operation 812, as illustrated in FIG. 8, in which a first gate structure is formed on the substrate and between the two second doped regions, and a second gate structure is formed over the portion of the substrate. For example, as illustrated in FIG. 6D, a first gate structure 608 is formed on third doped region 604 of substrate 621 and between two second doped regions 605. First gate structure 608 includes a first gate dielectric 607 formed on third doped region 604 of substrate 621 and a first gate electrode 609 formed on first gate dielectric 607. The HV transistor 601 (corresponding to HV transistor 401 in FIG. 4D) is formed thereafter. In some implementations, the forming of first gate structure and the forming of two second doped regions can be exchanged. That is, first gate structure 608 is formed on substrate 621, and then two second doped regions 605 are formed on two sides of first gate structure 608. In some implementations, second doped regions 605 are n-wells of HV transistor 601, and third doped region 604 is p-well of HV transistor 601. After the processes, a distance in a lateral direction (e.g., in the y-direction) between nearest (i.e., least distant) second doped region 605 and first doped region 613 can be equal to or more than 0.6 μm, or even more than 0.7 μm. The increased distance between nearest second doped region 605 and first doped region 613 may significantly improve the breakdown voltage of HV transistor 601. During the same deposition process, second gate structure 635 is formed over the portion of the substrate 633. Second gate structure 635 includes a second gate dielectric 637 formed over the portion of substrate 633 and a second gate electrode 639 formed on second gate dielectric 637. In some implementations, the forming of second gate dielectric 637 over the portion of substrate 633 and the forming of first gate dielectric 607 on third doped region 604 of substrate 621 are in the same deposition process. In some implementations, the forming of second gate electrode 639 on second gate dielectric 637 and the forming of first gate electrode 609 on first gate dielectric 607 are in the same deposition process. A 3D transistor 630 (corresponding to 3D transistor 430 in FIG. 4D) is formed thereafter. Specifically, the detailed forming of 3D transistor 630 can be described using FIGS. 4E-4G. 3D transistor 630 is formed by forming a 3D semiconductor body (i.e., 3D semiconductor body 446 in FIG. 4E) having a source (i.e., source 4461 in FIG. 4E), a drain (i.e., drain 4462 in FIG. 4E), and an active region (i.e., active region 4463) formed between the source and the drain. The 3D semiconductor body (i.e., 3D semiconductor body 446 in FIG. 4E) is formed in second recess 636 (as in FIG. 6B) extending through second trench isolation 631 (corresponding to second trench isolation 431 in FIG. 4E) in the z-direction. That is, at least a portion of the 3D semiconductor body (i.e., bottom portions of 3D semiconductor body 446 as in FIG. 4E) is surrounded by second trench isolation 631. 3D transistor 630 further includes gate structure 635 in contact with a portion of substrate 633. The portion of substrate 633 (corresponding to the portion of substrate 433 in FIGS. 4E and 4G) is surrounded by the source (i.e., source 4461 in FIG. 4E), and the drain (i.e., drain 4462 in FIG. 4E) in the x-direction and surrounded by second trench isolation 631 in the y-direction. The 3D semiconductor body (i.e., 3D semiconductor body 446 in FIG. 4E) at least partially extends above the top surface of substrate 621 to expose not only the top surface but also the two side surfaces of the 3D semiconductor body (i.e., 3D semiconductor body 446 in FIG. 4E). It is noted that, though 3D transistor 630 is illustrated in a z-y plane as in FIG. 6D and arranged side by side with HV transistor 601 and first trench isolation 611, it is not necessarily to be arranged in such a way. For instance, 3D transistor 630 can be rotated 90 degrees or at other orientations, or 3D transistor 630 can be arranged in a remote end of substrate 621 or even another substrate (not shown) but in the same wafer (not shown).

Figure 6E:
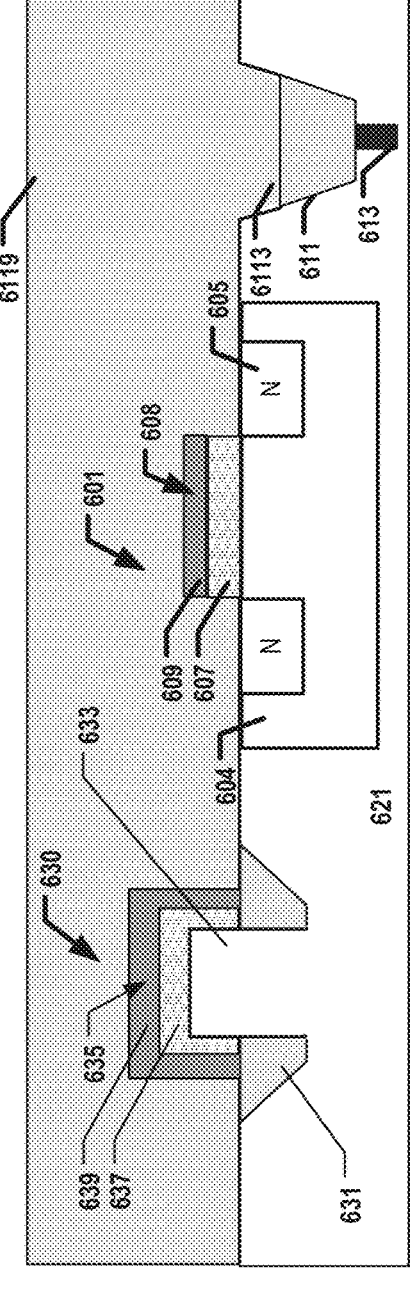
Figure 6E:
Figure 6F:
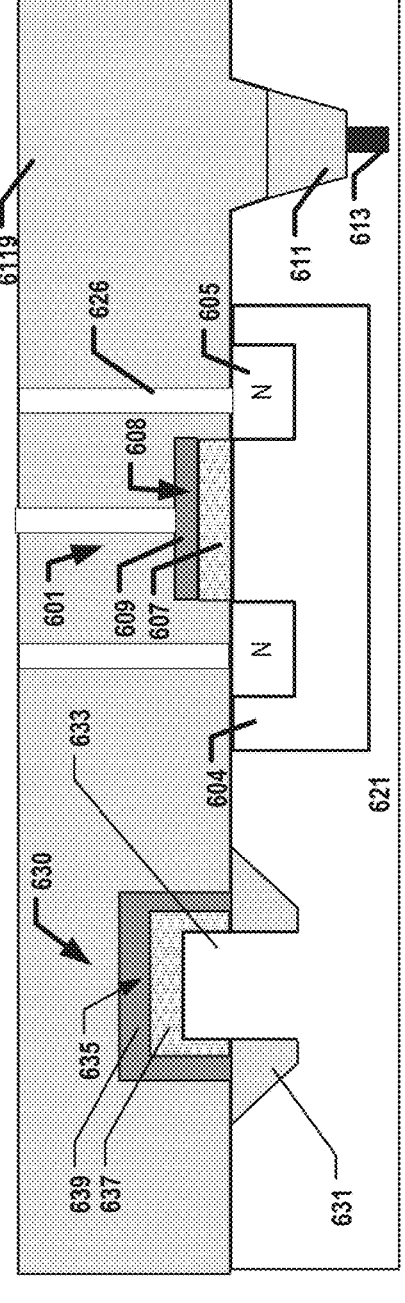

Next, method 800 proceeds to operation 814, as illustrated in FIG. 8, in which an interlayer dielectric is formed on the substrate covering the HV transistor, the first trench isolation, and the 3D transistor, and filling up the first recess. For example, as illustrated in FIG. 6E, interlayer dielectric 6119 is formed on substrate 621 covering HV transistor 601, first trench isolation 611, and 3D transistor 630, and filling up first recess 6113. Interlayer dielectric 6119 may include any suitable dielectric materials, such as silicon oxide, silicon nitride, silicon oxynitride, or high-k dielectrics (e.g., aluminum oxide, hafnium oxide, zirconium oxide, etc.). In some implementations, interlayer dielectric 6119 may include the same material as first trench isolation 611. Interlayer dielectric 6119 can be deposited using one or more thin film deposition processes including, but not limited to, chemical vapor deposition (CVD), physical vapor deposition (PVD), atomic layer deposition (ALD), or any combination thereof. Furthermore, after forming interlayer dielectric 6119, as illustrated in FIG. 6F, a wet/dry etching can be applied to interlayer dielectric 6119 to form contact holes 626 extending through interlayer dielectric 6119 in the z-direction to expose second doped region 605 and first gate electrode 609. Contact holes 626 are then filled up with electrode materials to form first electrode 425 and second electrode 427 as in FIG. 4D.

According to one aspect of the present disclosure, a semiconductor device includes a substrate, a first trench isolation in the substrate, a first doped region formed below the first trench isolation, a second doped region formed in the substrate, and a first gate structure formed adjacent to the second doped region. The first doped region is an ion implantation region, and a distance between the first doped region and the second doped region is equal to or more than 0.6 μm.

In some implementations, the second doped region is a drain region or a source region of a transistor.

In some implementations, a top surface of the first trench isolation is lower than a top surface of the substrate.

In some implementations, a width of the first doped region is equal to or less than 0.2 μm.

In some implementations, the first gate structure includes a first gate dielectric and a first gate electrode formed on the first gate dielectric.

In some implementations, the first gate electrode includes polysilicon.

In some implementations, the first doped region and the second doped region have different doping types.

In some implementations, the first doped region is doped with a p-type dopant. The second doped region is doped with an n-type dopant.

In some implementations, the semiconductor device further includes a second trench isolation in the substrate and surrounding a portion of the substrate, a three-dimension (3D) semiconductor body partially formed in the second trench isolation, and a second gate structure in contact with sides of the 3D semiconductor body. The second gate structure includes a second gate dielectric and a second gate electrode formed on the second gate dielectric.

According to another aspect, a memory device includes a memory cell array, and a peripheral circuit coupled to the memory cell array. The peripheral circuit includes a first circuit. The first circuit includes a semiconductor device. The semiconductor device includes a substrate, a first trench isolation in the substrate, a first doped region formed below the first trench isolation, a second doped region formed in the substrate, and a first gate structure formed adjacent to the second doped region. The first doped region is an ion implantation region, and a distance between the first doped region and the second doped region is equal to or more than 0.6 μm.

In some implementations, the first circuit is sustainable to voltages in the range of 5 V and 30 V.

In some implementations, the memory cell array includes an array of 3D NAND memory strings.

In some implementations, the peripheral circuit further includes a second circuit, the second circuit includes a 3D transistor.

In some implementations, the second circuit is sustainable to voltages in the range of 0.9 V and 2 V.

According to still another aspect, a method for forming a semiconductor device, includes forming a sacrificial first trench isolation in a substrate, etching back the sacrificial first trench isolation to form a first recess and a first trench isolation in the substrate, wherein the first recess is formed on the first trench isolation, forming a mask layer having a hole over the first recess and the first trench isolation, ion implanting via the hole to form a first doped region below the first trench isolation, and forming a second doped region in the substrate.

In some implementations, the method further includes forming a first gate structure on the substrate and adjacent to the second doped region.

In some implementations, a first portion of the mask layer is formed in the first recess and a second portion of the mask layer is formed on the substrate.

In some implementations, the first portion of the mask layer in the first recess is thinner than the second portion of the mask layer on the substrate.

In some implementations, the method further includes forming an interlayer dielectric to fill up the first recess.

In some implementations, ion implanting via the hole to form the first doped region below the first trench isolation includes ion implanting p-type dopant in the substrate.

In some implementations, forming the sacrificial first trench isolation in the substrate includes etching the substrate to form a first trench recess, forming an oxide layer covering the substrate and in the first trench recess, and removing the oxide layer covering the substrate and leaving the oxide layer in the first trench recess to form the sacrificial first trench isolation.

In some implementations, removing the oxide layer covering the substrate includes applying a chemical polishing process (CMP) over the oxide layer to remove the oxide layer covering the substrate.

According to yet still another aspect, a method for forming a semiconductor device, includes forming a sacrificial first trench isolation in a substrate and a second trench isolation in the substrate surrounding a protruding portion on the substrate, etching the sacrificial first trench isolation to form a first recess and a first trench isolation in the substrate and etching the second trench isolation to form a second recess in the second trench isolation, forming a mask layer having a hole over the first recess and the first trench isolation, ion implanting via the hole to form a first doped region below the first trench isolation, forming a second doped region in the substrate, and forming a first gate structure on the substrate and adjacent to the second doped region and a second gate structure over the protruding portion on the substrate.

In some implementations, the protruding portion on the substrate is a portion of the substrate.

In some implementations, forming the sacrificial first trench isolation in the substrate includes etching the substrate to form a first trench recess, forming a first oxide layer covering the substrate and in the first trench recess, and removing the first oxide layer covering the substrate and leaving the first oxide layer in the first trench recess to form the sacrificial first trench isolation.

In some implementations, forming the second trench isolation in the substrate surrounding the protruding portion on the substrate includes etching the substrate to form a second trench recess surrounding the protruding portion, forming a second oxide layer covering the protruding portion and in the second trench recess, and removing the second oxide layer covering the protruding portion and leaving the second oxide layer in the second trench recess to form the second trench isolation.

In some implementations, removing the second oxide layer covering the protruding portion includes applying a chemical polishing process (CMP) over the second oxide layer to remove the oxide layer covering the substrate.

In some implementations, etching the second trench isolation to form the second recess in the second trench isolation includes etching the second trench isolation to expose the substrate. The second recess is at least partially surrounded by the second trench isolation.

In some implementations, etching the second trench isolation to form the second recess in the second trench isolation includes etching back the second trench isolation to form a thinned second trench isolation.

In some implementations, the method further includes forming an interlayer dielectric to fill up the first recess.

In some implementations, the method further includes forming a third doped region in the substrate. The second doped region is formed in the third doped region.

In some implementations, forming the first gate structure further includes forming a first gate dielectric on the substrate, and forming a first gate electrode on the first gate dielectric. And forming the second gate structure further includes forming a second gate dielectric on the substrate, and forming a second gate electrode on the second gate dielectric.

In some implementations, the first recess and the second recess have a same depth.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:
a substrate;
a first trench isolation in the substrate;
a first doped region formed below the first trench isolation, a sidewall of the first doped region and a sidewall of the first trench isolation being surrounded by the same substrate;
a second doped region formed in the substrate; and
a first gate structure formed adjacent to the second doped region,
wherein:
a combination of the first trench isolation and the first doped region below the first trench isolation extends in a first lateral direction along a channel length and in a second lateral direction perpendicular to the first lateral direction;
the combination of the first trench isolation and the first doped region is spaced from a third doped region that surrounds the second doped region by the substrate in the first lateral direction and in the second lateral direction, the third doped region having a same doping type as the first doped region;
the first doped region is an ion implantation region;
the first gate structure extends, in the second lateral direction, beyond the third doped region, and is spaced from the combination of the first trench isolation and the first doped region by the substrate;
a first distance between the first doped region and the second doped region is equal to or more than 0.6 μm, and the first distance comprises a second distance between the third doped region and the first doped region; and
a top surface of the first trench isolation is lower than a top surface of the substrate and a top surface of the second doped region.

2. The semiconductor device of claim 1, wherein the second doped region is a drain region or a source region of a transistor.

3. The semiconductor device of claim 1, wherein a width of the first doped region is equal to or less than 0.2 μm.

4. The semiconductor device of claim 1, wherein the first gate structure comprises a first gate dielectric and a first gate electrode formed on the first gate dielectric, the first gate dielectric being sandwiched between the third doped region and the first gate electrode, and the first gate electrode being connected with a second electrode extending through an interlayer dielectric over the first trench isolation.

5. The semiconductor device of claim 4, wherein the first gate electrode comprises polysilicon.

6. The semiconductor device of claim 1, wherein the first doped region and the second doped region have different doping types.

7. The semiconductor device of claim 6, wherein the first doped region is doped with a p-type dopant, wherein the second doped region is doped with an n-type dopant.

8. The semiconductor device of claim 1, further comprising:
a second trench isolation in the substrate;
a three-dimension (3D) semiconductor body partially formed in the second trench isolation; and
a second gate structure in contact with sides of the 3D semiconductor body, wherein the second gate structure comprises a second gate dielectric and a second gate electrode formed on the second gate dielectric.

9. The semiconductor device of claim 1, wherein:
in a plan view, a projection of the first trench isolation is non-overlapping with a projection of the first gate structure.

10. The semiconductor device of claim 1, wherein:
in the first lateral direction, a width of the first trench isolation is greater than a width of the first doped region, a projection of the first trench isolation being at two sides of a projection of the first doped region in a plan view; and
the first doped region is surrounded by the substrate.

11. The semiconductor device of claim 1, further comprising:
the third doped region arranged below the second doped region and the first gate structure, wherein in a plan view, the third doped region is partially arranged between the first doped region and the second doped region in the first lateral direction; and
the first doped region is surrounded by the substrate.

12. The semiconductor device of claim 1, wherein:
the first doped region extends, in the second lateral direction, beyond the first gate structure.

13. The semiconductor device of claim 12, wherein:
in the second lateral direction, a length of the first doped region is greater than a length of the first gate structure.

14. The semiconductor device of claim 1, wherein:
the first gate structure is arranged on a side of the combination of the first doped region and the first trench isolation along the second lateral direction; and
a second gate structure is arranged on an opposite side of the combination of the first doped region and the first trench isolation along the second lateral direction, the first gate structure and the second gate structure being located on a same side of the combination of the first doped region and the first trench isolation along the first lateral direction.

15. A memory device, comprising:
a memory cell array; and
a peripheral circuit coupled to the memory cell array, the peripheral circuit comprising:
a first circuit, the first circuit comprising: a semiconductor device, the semiconductor device comprising:
a substrate;
a first trench isolation in the substrate;
a first doped region formed below the first trench isolation, a sidewall of the first doped region and a sidewall of the first trench isolation being surrounded by the same substrate;
a second doped region formed in the substrate; and
a first gate structure formed adjacent to the second doped region and comprising a first gate dielectric and a first gate electrode formed on the first gate dielectric,
wherein:
a combination of the first trench isolation and the first doped region below the first trench isolation extends in a first lateral direction along a channel length and in a second lateral direction perpendicular to the first lateral direction;
the first doped region is an ion implantation region;
the first gate structure extends, in the second lateral direction, beyond a third doped region that surrounds the second doped region, and is spaced from the combination of the first trench isolation and the first doped region by the substrate;
in a plan view, a second portion of the substrate and a third portion of the substrate are arranged between the first doped region and a third doped region in the first lateral direction and in the second lateral direction, respectively, the third doped region being arranged below the second doped region and having a same doping type of the first doped region;

a first distance between the first doped region and the second doped region is equal to or more than 0.6 μm, and the first distance comprises a second distance between the third doped region and the first doped region;

the first gate dielectric is sandwiched between the third doped region and the first gate electrode, the first gate electrode being connected with a second electrode extending through an interlayer dielectric over the first trench isolation; and a top surface of the first trench isolation is lower than a top surface of the second doped region.

16. The memory device of claim 15, wherein the first circuit is sustainable to voltages in a range of 5 V and 30 V.

17. The memory device of claim 15, wherein the memory cell array comprises an array of 3D NAND memory strings.

18. The memory device of claim 15, wherein the peripheral circuit further comprises a second circuit, the second circuit comprising a 3D transistor.

19. The memory device of claim 18, wherein the second circuit is sustainable to voltages in a range of 0.9 V and 2 V.

20. A semiconductor device, comprising:

a first doped region in a substrate, and a first trench isolation above the first doped region; and a first transistor comprising a first gate structure and a second doped region at a first side of the first gate structure, the second doped region being arranged between the first gate structure and a combination of the first doped region and the first trench isolation, wherein:

a second transistor comprises a three-dimensional (3D) semiconductor body and a second trench isolation in the substrate and is arranged at a second side of the first gate structure, the second side being opposite to the first side;

the combination of the first doped region and the first trench isolation is absent, at the second side of the first gate structure, between the first transistor and the second transistor;

a first distance between the first doped region and the second doped region is equal to or more than 0.6 μm in a channel length direction, and the first distance comprises a second distance between the first doped region and a third doped region of the first transistor, the third doped region being arranged below the second doped region and having a same doping type of the first doped region; and a top surface of the first trench isolation is lower than a top surface of the substrate by a third distance, and the 3D semiconductor body of the second transistor extends through the second trench isolation by a fourth distance identical to the third distance.

* * * * *